(12) United States Patent
Shibayama et al.

(10) Patent No.: US 10,613,440 B2
(45) Date of Patent: Apr. 7, 2020

(54) SILICON-CONTAINING EUV RESIST UNDERLAYER FILM-FORMING COMPOSITION CONTAINING ONIUM SULFONATE

(71) Applicant: NISSAN CHEMICAL INDUSTRIES, LTD., Tokyo (JP)

(72) Inventors: Wataru Shibayama, Toyama (JP); Shuhei Shigaki, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/414,942

(22) PCT Filed: Jul. 29, 2013

(86) PCT No.: PCT/JP2013/070461
§ 371 (c)(1),
(2) Date: Jan. 15, 2015

(87) PCT Pub. No.: WO2014/021256
PCT Pub. Date: Feb. 6, 2014

(65) Prior Publication Data
US 2015/0210829 A1 Jul. 30, 2015

(30) Foreign Application Priority Data

Jul. 30, 2012 (JP) ................. 2012-168728

(51) Int. Cl.
| | |
|---|---|
| *G03F 7/075* | (2006.01) |
| *G03F 7/09* | (2006.01) |
| *G03F 7/11* | (2006.01) |
| *G03F 7/004* | (2006.01) |
| *H01L 21/311* | (2006.01) |
| *H01L 21/3105* | (2006.01) |
| *C08K 5/42* | (2006.01) |
| *C09D 183/04* | (2006.01) |

(52) U.S. Cl.
CPC .............. *G03F 7/0752* (2013.01); *C08K 5/42* (2013.01); *C09D 183/04* (2013.01); *G03F 7/0045* (2013.01); *G03F 7/0755* (2013.01); *G03F 7/0757* (2013.01); *G03F 7/091* (2013.01); *G03F 7/094* (2013.01); *G03F 7/11* (2013.01); *H01L 21/3105* (2013.01); *H01L 21/31138* (2013.01); *H01L 21/31144* (2013.01)

(58) Field of Classification Search
None
See application file for complete search history.

(56) References Cited

U.S. PATENT DOCUMENTS

| | | | | |
|---|---|---|---|---|
| 6,576,393 | B1 * | 6/2003 | Sugita et al. | ............. 430/270.1 |
| 2001/0036589 | A1 * | 11/2001 | Kinoshita | ............. G03F 7/0045 |
| | | | | 430/270.1 |
| 2001/0038967 | A1 * | 11/2001 | Mizutani | ............... G03F 7/0757 |
| | | | | 430/270.1 |
| 2003/0148211 | A1 * | 8/2003 | Kamabuchi | ........... C07C 311/48 |
| | | | | 430/270.1 |
| 2007/0196764 | A1 * | 8/2007 | Hirosaki | ............... G03F 7/0392 |
| | | | | 430/270.1 |
| 2008/0312400 | A1 * | 12/2008 | Yamashita | ............. C08G 77/28 |
| | | | | 528/30 |
| 2010/0086870 | A1 | 4/2010 | Ogihara et al. | |
| 2011/0143149 | A1 * | 6/2011 | Shibayama | ........... C09D 183/08 |
| | | | | 428/447 |
| 2011/0287369 | A1 | 11/2011 | Shibayama et al. | |
| 2012/0178261 | A1 | 7/2012 | Kanno et al. | |

(Continued)

FOREIGN PATENT DOCUMENTS

| | | |
|---|---|---|
| CN | 102498440 A | 6/2012 |
| EP | 2 249 204 A1 | 11/2010 |

(Continued)

OTHER PUBLICATIONS

Aug. 20, 2013 International Search Report issued in International Application No. PCT/JP2013/070461.
Aug. 20, 2013 Written Opinion issued in International Application No. PCT/JP2013/070461.
Apr. 4, 2016 Search Report issued in European Patent Application No. EP 13 82 5237.4.
Mar. 29, 2018 Office Action issued in European Patent Application No. 13825237.4.

*Primary Examiner* — Sin J Lee
(74) *Attorney, Agent, or Firm* — Oliff PLC

(57) ABSTRACT

A resist underlayer film-forming composition for EUV lithography showing good resist shape; including: a hydrolyzable organosilane, a hydrolyzed product thereof, or a hydrolyzed condensate thereof, as a silane; and a salt of a sulfonic acid ion containing a hydrocarbon group with an onium ion. The hydrolyzable organosilane includes at least one organic silicon compound selected from the group consisting of compounds of Formula (1):

$$R^1_a Si(R^2)_{4-a} \qquad \text{Formula (1)}$$

and compounds of Formula (2):

$$[R^3_c Si(R^4)_{3-c}]_2 Y_b \qquad \text{Formula (2)}$$

a hydrolyzed product thereof, or a hydrolyzed condensate thereof. A method for manufacturing a semiconductor device, including: forming an organic underlayer film on a semiconductor substrate; a resist underlayer film by applying the resist underlayer film-forming composition onto the organic underlayer film, then baking applied resist underlayer film-forming composition; forming a resist film by applying composition for EUV resists onto resist underlayer film; EUV-exposing the resist film; and obtaining a resist pattern by developing exposed resist film.

7 Claims, No Drawings

(56) References Cited

U.S. PATENT DOCUMENTS

| | | | |
|---|---|---|---|
| 2012/0267766 A1* | 10/2012 | Kim | G03F 7/0752 257/635 |
| 2012/0315765 A1 | 12/2012 | Nakajima et al. | |
| 2013/0045601 A1* | 2/2013 | Ogihara | G03F 7/091 438/694 |
| 2013/0130179 A1* | 5/2013 | Anno et al. | 430/286.1 |
| 2014/0170855 A1* | 6/2014 | Nakajima | G03F 7/0752 438/703 |

FOREIGN PATENT DOCUMENTS

| | | |
|---|---|---|
| EP | 2 372 458 A1 | 10/2011 |
| JP | 2000-356854 A | 12/2000 |
| JP | 2004341479 A | 12/2004 |
| JP | 2008076889 A | 4/2008 |
| JP | 2008158002 A | 7/2008 |
| JP | 2010085912 A | 4/2010 |
| JP | 2010237667 A | 10/2010 |
| WO | 2010071155 A1 | 6/2010 |
| WO | WO 2011/081321 A2 * | 7/2011 |
| WO | 2011102470 A1 | 8/2011 |
| WO | WO 2012/008538 A1 * | 1/2012 |
| WO | WO 2013/022099 A1 * | 2/2013 |

* cited by examiner ably SILICON-CONTAINING EUV RESIST
UNDERLAYER FILM-FORMING
COMPOSITION CONTAINING ONIUM
SULFONATE

TECHNICAL FIELD

The present invention relates to a composition for forming an underlayer film between a substrate and a resist (for example, an EUV resist), which are used for manufacturing semiconductor devices. Particularly, the present invention relates to a resist underlayer film-forming composition for lithography, which is used to form underlayer films used as under layers of resists in a lithography process for manufacturing semiconductor devices. The present invention further relates to a method for forming a resist pattern by using the underlayer film-forming composition.

BACKGROUND ART

In manufacturing semiconductor devices, fine processing with lithography using photoresists has been conventionally performed. The fine processing includes: forming a thin film of a photoresist on a semiconductor substrate such as a silicon wafer; irradiating the substrate with active light such as ultraviolet through a mask pattern having a pattern of semiconductor device; developing the substrate; and treating the substrate by etching with an obtained photoresist pattern as a protection film. In such a manner, fine concavities and convexities matching the pattern are formed on the surface of the substrate. In recent years, semiconductor devices have become highly integrated, and a wavelength of active light to be used has become shorter, such that from KrF excimer lasers (248 nm) to ArF excimer lasers (193 nm) and EUV light (13.5 nm).

Thus, controlling of profiles (resist shapes) and improved adhesion to substrates are required for resists more than before.

As an underlayer film between a semiconductor substrate and a photoresist, a hardmask that is a film containing a metal element such as silicon has been used. In this case, the components of a resist and a hardmask significantly differ from each other, and thus the removal rates of them by dry etching largely depend on gas species used in dry etching. By selecting proper gas species, a hardmask can be removed by dry etching without larger decrease in the film thickness of a photoresist. As stated, in recent years, a resist underlayer film has been placed between a semiconductor substrate and a photoresist in manufacturing of semiconductor devices so that a variety of effects are achieved (see Patent Documents 1 and 2).

Although investigations have been made to compositions for resist underlayer films so far, development of novel materials for resist underlayer films are required for satisfying various requirements for properties of the resist underlayer films.

PRIOR ART DOCUMENTS

Patent Documents

Patent Document 1: Japanese Patent Application Publication No. 2008-076889 (JP 2008-076889 A)
Patent Document 2: Japanese Patent Application Publication No. 2010-237667 (JP 2010-237667 A)

SUMMARY OF THE INVENTION

Problem to be Solved by the Invention

An object of the present invention is to provide a resist underlayer film-forming composition for EUV lithography, which allows fine processing of a substrate by utilizing a rectangular resist pattern and can be used in manufacturing of semiconductor devices. Particularly, an object of the present invention is to provide a resist underlayer film-forming composition for lithography, which is used to form a resist underlayer film that can be used as a hardmask. Another object of the present invention is to provide a resist underlayer film-forming composition that improves exposing sensitivity of an EUV resist, does not intermix with a resist, and has a larger dry etching rate than that of a resist.

Means for Solving the Problem

The present invention provides: as a first aspect, a resist underlayer film-forming composition for EUV lithography, comprising: a hydrolyzable organosilane, a hydrolyzed product thereof, or a hydrolyzed condensate thereof, as a silane; and a salt of a sulfonic acid ion containing a hydrocarbon group with an onium ion;

as a second aspect, the resist underlayer film-forming composition according to the first aspect, in which the hydrolyzable organosilane comprises at least one organic silicon compound selected from the group consisting of compounds of Formula (1):

    Formula (1)

(in Formula (1), $R^1$ is a salt of a sulfonic acid ion containing a hydrocarbon group with an onium ion, an alkyl group, an aryl group, an aralkyl group, a halogenated alkyl group, a halogenated aryl group, a halogenated aralkyl group, or an alkenyl group, or is an organic group having an epoxy group, an acryloyl group, a methacryloyl group, a mercapto group, an alkoxyaryl group, an acyloxyaryl group, an isocyanurate group, a hydroxy group, a cyclic amino group, or a cyano group, or is a combination of such organic groups, and is bonded to a silicon atom through an Si—C bond; $R^2$ is an alkoxy group, an acyloxy group, or a halogen group; and a is an integer of 0 to 3)
and compounds of Formula (2):

    Formula (2)

(in Formula (2), $R^3$ is an alkyl group; $R^4$ is an alkoxy group, an acyloxy group, or a halogen group; Y is an alkylene group or an arylene group; b is an integer of 0 or 1; and c is an integer of 0 or 1),
a hydrolyzed product thereof, or a hydrolyzed condensate thereof;

as a third aspect, the resist underlayer film-forming composition according to the second aspect, in which the resist underlayer film-forming composition comprises the hydrolyzed condensate of the compound of Formula (1) as a polymer;

as a fourth aspect, the resist underlayer film-forming composition according to any one of the first to the third aspects, in which the onium ion is a sulfonium ion or an ammonium ion;

as a fifth aspect, the resist underlayer film-forming composition according to any one of the first to the fourth aspects, in which the onium ion contains at least one organic group having an aromatic ring;

as a sixth aspect, the resist underlayer film-forming composition according to any one of the first to the fifth aspects, in which a portion of a hydrocarbon group of the sulfonic acid ion containing a hydrocarbon group is optionally substituted;

as a seventh aspect, the resist underlayer film-forming composition according to any one of the first to the sixth aspects, further comprising an acid;

as an eighth aspect, the resist underlayer film-forming composition according to any one of the first to the seventh aspects, further comprising water;

as a ninth aspect, a resist underlayer film-forming composition for EUV lithography, comprising: a hydrolyzable organosilane, a hydrolyzed product thereof, or a hydrolyzed condensate thereof, as a silane, in which the hydrolyzable organosilane is an organic silicon compound of Formula (2):

 Formula (2)

(in Formula (2), $R^3$ is an alkyl group; $R^4$ is an alkoxy group, an acyloxy group, or a halogen group; Y is an alkylene group or an arylene group; b is an integer of 0 or 1; and c is an integer of 0 or 1);

as a tenth aspect, the resist underlayer film-forming composition according to the ninth aspect, further comprising an acid;

as an eleventh aspect, the resist underlayer film-forming composition according to the ninth aspect or the tenth aspect, further comprising water;

as a twelfth aspect, a resist underlayer film obtained by applying the resist underlayer film-forming composition as described in any one of the first to the eleventh aspects onto a semiconductor substrate, and then baking the applied resist underlayer film-forming composition;

as a thirteenth aspect, a method for manufacturing a semiconductor device, the method comprising: forming a resist underlayer film by applying the resist underlayer film-forming composition as described in any one of the first to the eleventh aspects onto a semiconductor substrate and then baking the applied resist underlayer film-forming composition; forming a resist film by applying a composition for EUV resists onto the underlayer film; EUV-exposing the resist film; obtaining a resist pattern by developing the exposed resist film; etching the resist underlayer film with the resist pattern; and processing the semiconductor substrate with the patterned resist film and the patterned resist underlayer film; and as a fourteenth aspect, a method for manufacturing a semiconductor device, the method comprising: forming an organic underlayer film on a semiconductor substrate; forming a resist underlayer film by applying the resist underlayer film-forming composition as described in any one of the first to the eleventh aspects onto the organic underlayer film, and then baking the applied resist underlayer film-forming composition; forming a resist film by applying a composition for EUV resists onto the resist underlayer film; EUV-exposing the resist film; obtaining a resist pattern by developing the exposed resist film; etching the resist underlayer film with the resist pattern; etching the organic underlayer film with the patterned resist underlayer film; and processing the semiconductor substrate with the patterned organic underlayer film.

Effects of the Invention

In the present invention, the resist underlayer film is formed by application on a substrate, or is formed by application on an organic underlayer film formed on the substrate, and then a resist film (for example, an EUV resist) is formed on the resist underlayer film. After that, a resist pattern is formed by exposure followed by development, and the resist underlayer film is dry etched by using the resist pattern to transfer the pattern onto the resist underlayer film, and then the substrate is processed with the pattern, or the organic underlayer film is etched to transfer the pattern thereon, and then the substrate is processed by using the organic underlayer film.

To form a fine pattern, a resist tends to be a thinner film to prevent collapse of the pattern. When a resist is such a thin film, the etching rate of the underlayer film thereof should be higher than that of the resist film; otherwise a pattern cannot be transferred by dry etching. In the present invention, a substrate is coated with the resist underlayer film of the present invention (containing an inorganic silicon compound) directly, or via an organic underlayer film, and the coated substrate is further coated with a resist film (an organic resist film). Dry etching rates of a film having an organic component and that having an inorganic component significantly change depending on a selected etching gas. The dry etching rate of a film having an organic component increases by using an oxygen gas, while the dry etching rate of a film having an inorganic component increases by using a halogen-containing gas.

For example, after a resist pattern is formed, the resist underlayer film of the present invention, which exists under the resist film, is dry etched with a halogen-containing gas to transfer the pattern onto the resist underlayer film, and a substrate is processed by using the pattern transferred to the resist underlayer film, with a halogen-containing gas. Alternatively, an organic underlayer film, which exists under the resist underlayer film, is dry etched by using the resist underlayer film on which the pattern has been transferred, with an oxygen gas to transfer the pattern onto the organic underlayer film, and a substrate is processed by using the organic underlayer film on which the pattern has been transferred, with a halogen-containing gas.

Controlling acidity of a silicon-containing resist underlayer film has been recognized as important to regulate the shape of a resist. In the present invention, the inventors have found that addition of a sulfonic acid onium salt to a silicon-containing resist underlayer film is effective to control the acidity of the silicon-containing resist underlayer film. By adding the sulfonic acid onium salt, in an area of a photoresist where an excess of acids exist, acidity of the area can be reduced, so that adhesion between the photoresist and a silicon-containing resist underlayer film can be improved. In contrast, in an area of a photoresist where acids do not exist much, a sulfonic acid onium salt reverses the effect of a base component contained in the photoresist, so that the resolution of the photoresist can be improved. Accordingly, by introducing the sulfonic acid onium salt, a silicon-containing resist underlayer film having the buffering effect of controlling acidity will be obtained, and whereby the shape of a resist can be regulated.

Furthermore, by containing the compound of Formula (2), which is used in the present invention, a cured film is made dense, and thus is more suitable as a hardmask.

MODES FOR CARRYING OUT THE INVENTION

The present invention is a resist underlayer film-forming composition for EUV lithography, which comprises a hydrolyzable organosilane, a hydrolyzed product thereof, or a hydrolyzed condensate thereof, as a silane, and further comprises a salt of a sulfonic acid ion containing a hydrocarbon group with an onium ion.

The resist underlayer film-forming composition of the present invention comprises a hydrolyzable organosilane, a hydrolyzed product thereof, or a hydrolyzed condensate thereof as a silane, and further comprises a salt of a sulfonic acid ion containing a hydrocarbon group with an onium ion. In addition, the resist underlayer film-forming composition may contain, as optional components, an acid, water, an alcohol, a curing catalyst, an acid generator, another organic polymer, a light absorptive compound, a surfactant, and the like.

The solid content in the resist underlayer film-forming composition of the present invention is, for example, 0.1% by mass to 50% by mass, 0.1% by mass to 30% by mass, or 0.1% by mass to 25% by mass. Note that the solid content refers to a content of all components except solvent components of the resist underlayer film-forming composition.

The percentage of the silane (hydrolyzable silane, a hydrolyzed product thereof, or a hydrolyzed condensate thereof) in a solid content is 20% by mass or greater, for example, 50% by mass to 99.9% by mass, 60% by mass to 99.9% by mass, or 70% by mass to 99.0% by mass.

The percentage of the salt of a sulfonic acid ion containing a hydrocarbon group with an onium ion in a solid content is, for example, 0.1% by mass to 10% by mass or 0.1% by mass to 5% by mass.

The hydrolyzable organosilane of above comprises at least one organic silicon compound selected from the group consisting of a type of organic silicon compounds of Formula (1) and a type of organic silicon compounds of Formula (2), a hydrolyzed product thereof, or a hydrolyzed condensate thereof.

In Formula (1), $R^1$ is a salt of a sulfonic acid ion containing a hydrocarbon group with an onium ion, an alkyl group, an aryl group, an aralkyl group, a halogenated alkyl group, a halogenated aryl group, a halogenated aralkyl group, or an alkenyl group, or is an organic group having an epoxy group, an acryloyl group, a methacryloyl group, a mercapto group, an alkoxyaryl group, an acyloxyaryl group, an isocyanurate group, a hydroxy group, a cyclic amino group, or a cyano group, or is a combination thereof, and is bonded to a silicon atom with an Si—C bond; $R^2$ is an alkoxy group, an acyloxy group, or a halogen group; and a is an integer of 0 to 3.

The alkyl group of above is a linear or branched $C_{1-10}$ alkyl group, and examples thereof include a methyl group, an ethyl group, an n-propyl group, an i-propyl group, an n-butyl group, an i-butyl group, an s-butyl group, a t-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group. A cyclic alkyl group can also be used, and examples of a $C_{1-10}$ cyclic alkyl group include a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the aryl group include $C_{6-20}$ aryl groups, specifically including a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-mercaptophenyl group, an o-methoxyphenyl group, a p-methoxyphenyl group, a p-aminophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group and a 9-phenanthryl group.

Examples of the alkenyl group include $C_{2-10}$ alkenyl groups, specifically including an ethenyl group, a 1-propenyl group, a 2-propenyl group, a 1-methyl-1-ethenyl group, a 1-butenyl group, a 2-butenyl group, a 3-butenyl group, a 2-methyl-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2- propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

The aralkyl group is an alkyl group substituted with an aryl group, and examples thereof include $C_{1-10}$ alkyl groups substituted with phenyl, specifically including a benzyl group, an ethylphenyl group, a propylphenyl group, and a butylphenyl group.

Examples of the halogenated alkyl group, the halogenated aryl group, and the halogenated aralkyl group include organic groups in which each of these groups is substituted with a halogen atom, such as fluorine, chlorine, bromine, and iodine.

Examples of the organic group having an epoxy group include a glycidoxymethyl group, a glycidoxyethyl group, a glycidoxypropyl group, a glycidoxybutyl group, and an epoxycyclohexyl group.

Examples of the organic group having an acryloyl group include an acryloylmethyl group, an acryloylethyl group, and an acryloylpropyl group.

Examples of the organic group having a methacryloyl group include a methacryloylmethyl group, a methacryloylethyl group, and a methacryloylpropyl group.

Examples of the organic group having a mercapto group include an ethylmercapto group, a butylmercapto group, a hexylmercapto group, and an octylmercapto group.

The organic group having an alkoxyaryl group is an aryl group substituted with an alkoxy group or an organic group having such an aryl group. Examples of the alkoxy group and the aryl group are described above and below.

The organic group having an acyloxyaryl group is an aryl group substituted with an acyloxy group or an organic group having such an aryl group. Examples of the acyloxy group and the aryl group are described above and below.

Examples of the organic group having an isocyanurate group include an isocyanurate group or a cyanurate alkylene group, and examples of the alkylene group correspond to the examples of the alkyl group described above. The isocyanurate group is optionally substituted with an alkenyl group such as an allyl group, an epoxy-containing group such as a glycidyl group, or an alkyl group.

Examples of the organic group having a hydroxy group include a hydroxy group, or a hydroxyalkyl group or a hydroxyalkylene group. Examples of the alkyl group are described above, and examples of the alkylene group correspond to the examples of the alkyl group.

Examples of the organic group having a cyclicamino group include a cyclicamino group and a cyclicaminoalkylene group. Examples of the cyclicamino group include an imidazole group and a 4,5-dihydroimidazole group. Examples of the cyclicaminoalkylene group correspond to the examples of the alkyl group described above, and specific examples thereof include a propylimidazole group and a propyl-4,5-dihydroimidazole group. These groups can be used as cyclic amine compounds.

Examples of the organic group having a cyano group include a cyanoethyl group and a cyanopropyl group.

Examples of the alkoxy group include an alkoxy group having a linear, branched, or cyclic $C_{1-20}$ alkyl portion, and specific examples thereof include a methoxy group, an ethoxy group, an n-propoxy group, an i-propoxy group, an n-butoxy group, an i-butoxy group, an s-butoxy group, a t-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2,-trimethyl-n-propoxy group, a 1-ethyl-1-methyl-n-propoxy group, and a 1-ethyl-2-methyl-n-propoxy group; and examples of the cyclic alkoxy group include a cyclopropoxy group, a cyclobutoxy group, a 1-methyl-cyclopropoxy group, a 2-methyl-cyclopropoxy group, a cyclopentyloxy group, a 1-methyl-cyclobutoxy group, a 2-methyl-cyclobutoxy group, a 3-methyl-cyclobutoxy group, a 1,2-dimethyl-cyclopropoxy group, a 2,3-dimethyl-cyclopropoxy group, a 1-ethyl-cyclopropoxy group, a 2-ethyl-cyclopropoxy group, a cyclohexyloxy group, a 1-methyl-cyclopentyloxy group, a 2-methyl-cyclopentyloxy group, a 3-methyl-cyclopentyloxy group, a 1-ethyl-cyclobutoxy group, a 2-ethyl-cyclobutoxy group, a 3-ethyl-cyclobutoxy group, a 1,2-dimethyl-cyclobutoxy group, a 1,3-dimethyl-cyclobutoxy group, a 2,2-dimethyl-cyclobutoxy group, a 2,3-dimethyl-cyclobutoxy group, a 2,4-dimethyl-cyclobutoxy group, a 3,3-dimethyl-cyclobutoxy group, a 1-n-propyl-cyclopropoxy group, a 2-n-propyl-cyclopropoxy group, a 1-i-propyl-cyclopropoxy group, a 2-i-propyl-cyclopropoxy group, a 1,2,2-trimethyl-cyclopropoxy group, a 1,2,3-trimethyl-cyclopropoxy group, a 2,2,3-trimethyl-cyclopropoxy group, a 1-ethyl-2-methyl-cyclopropoxy group, a 2-ethyl-1-methyl-cyclopropoxy group, a 2-ethyl-2-methyl-cyclopropoxy group, and a 2-ethyl-3-methyl-cyclopropoxy group.

Examples of the acyloxy group include a $C_{2-20}$ acyloxy group, and specific examples thereof include a methylcarbonyloxy group, an ethylcarbonyloxy group, an n-propylcarbonyloxy group, an i-propylcarbonyloxy group, an n-butylcarbonyloxy group, an i-butylcarbonyloxy group, an s-butylcarbonyloxy group, a t-butylcarbonyloxy group, an n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, an n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy group, a 3,3-dimethyl-n-butylcarbonyloxy group, a 1-ethyl-n-butylcarbonyloxy group, a 2-ethyl-n-butylcarbonyloxy group, a 1,1,2-trimethyl-n-propylcarbonyloxy group, a 1,2,2-trimethyl-n- propylcarbonyloxy group, a 1-ethyl-1-methyl-n-propylcarbonyloxy group, a 1-ethyl-2-methyl-n-propylcarbonyloxy group, a phenylcarbonyloxy group, and a tosylcarbonyloxy group.

Examples of a halogen group include fluorine, chlorine, bromine, and iodine.

Examples of the hydrolyzable organosilane of Formula (1) include tetramethoxysilane, tetrachlorosilane, tetraacetoxysilane, tetraethoxysilane, tetra n-propoxysilane, tetraisopropoxysilane, tetra n-butoxysilane, tetraacetoxysilane, methyltrimethoxysilane, methyltriethoxysilane, methyltrichlorosilane, methyltriacetoxysilane, methyltripropoxysilane, methyltriacetyloxysilane, methyltributoxysilane, methyltripropoxysilane, methyltriamyloxy silane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltrichlorosilane, vinyltriacetoxysilane, vinyltriethoxysilane, vinyltriacetoxysilane, phenyltrimethoxysilane, phenyltrichlorosilane, phenyltriacetoxysilane, phenyltriethoxysilane, phenyltriacetoxysilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, methylvinyldiethoxysilane, phenylsulfonylaminopropyltriethoxysilane, methylsulfonylaminopropyltriethoxysilane, phenylsulfonylaminopropyltrimethoxysilane, and methylsulfonylaminopropyltrimethoxysilane.

In particular, a combination of a tetraalkoxysilane, such as tetramethoxysilane and tetraethoxysilane, and a phenyltrialkoxysilane, such as phenyltrimethoxysilane and phenyltriethoxysilane, is preferable. Preferably, an alkyltrialkoxysilane, such as methyltrimethoxysilane and methyltriethoxysilane, is further combined to the combination of above.

Examples of the hydrolyzable organosilane of Formula (1) can also include the following structures. $R^2$ in the formulae is defined in the same manner as $R^2$ in Formula (1).

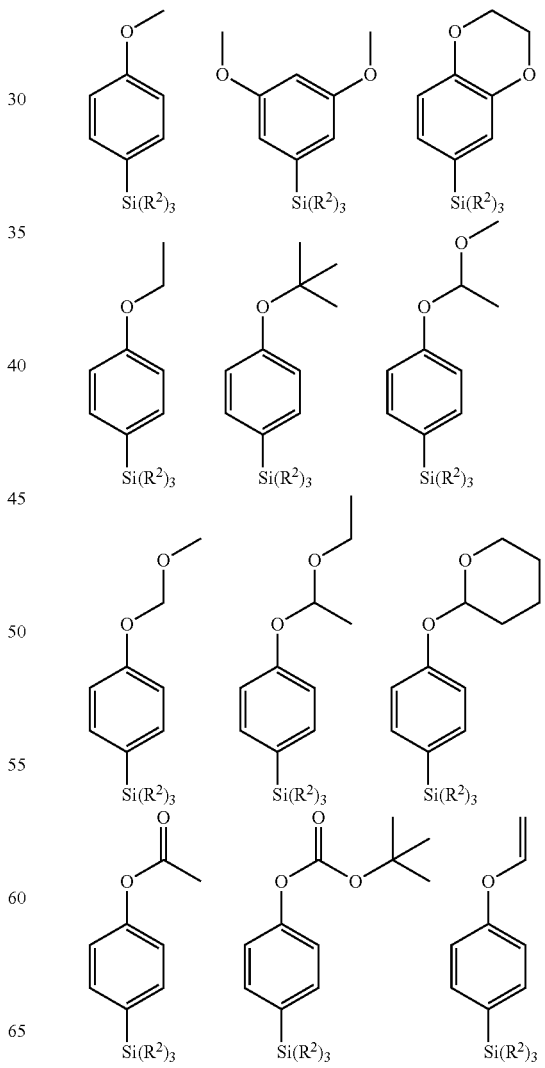

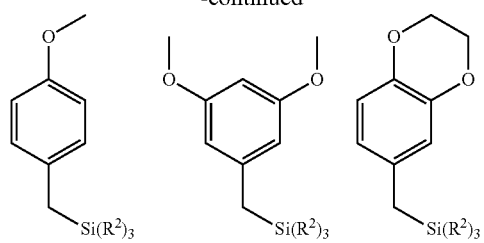
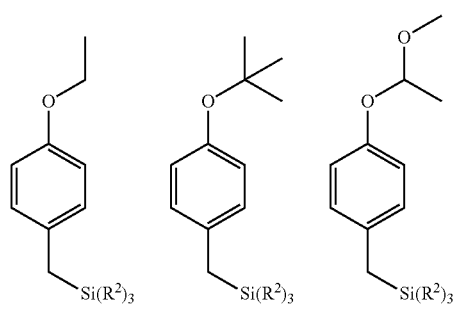
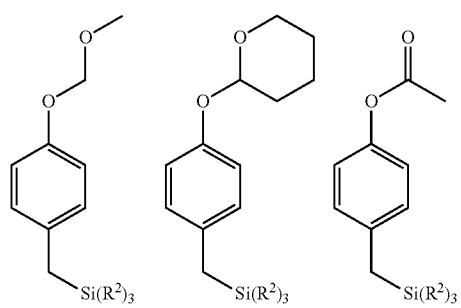
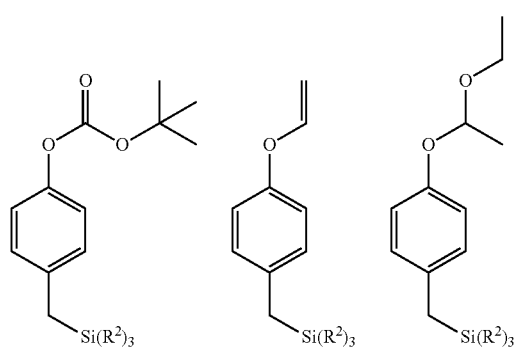
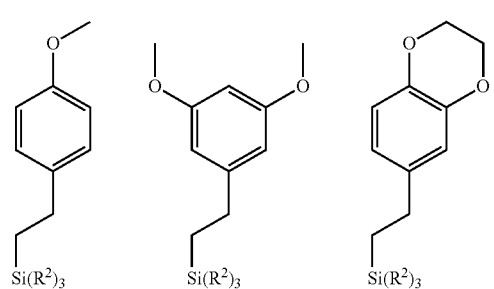
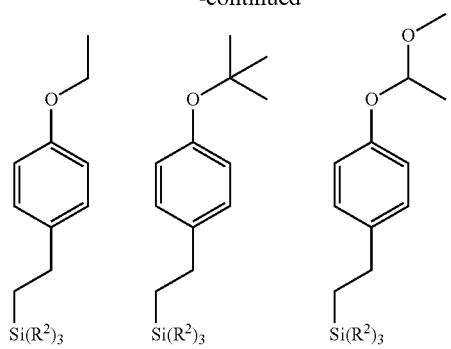
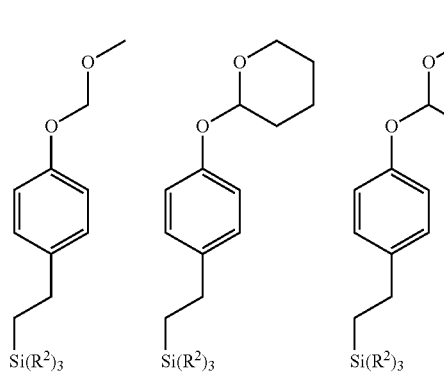
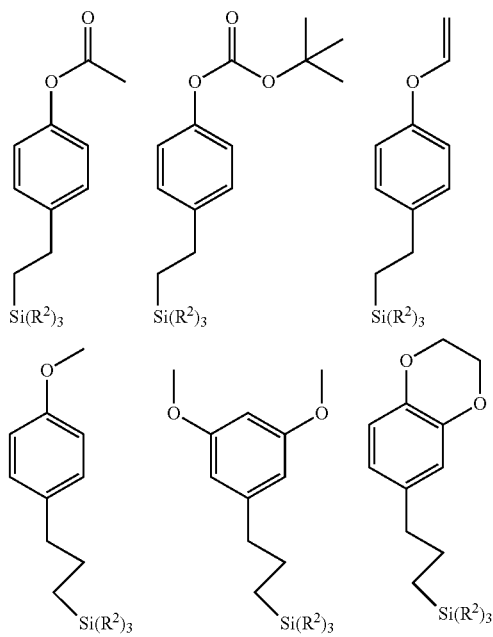
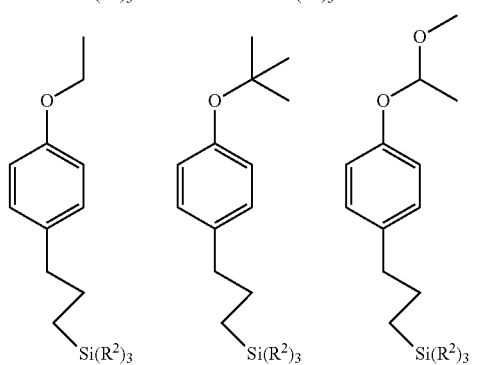

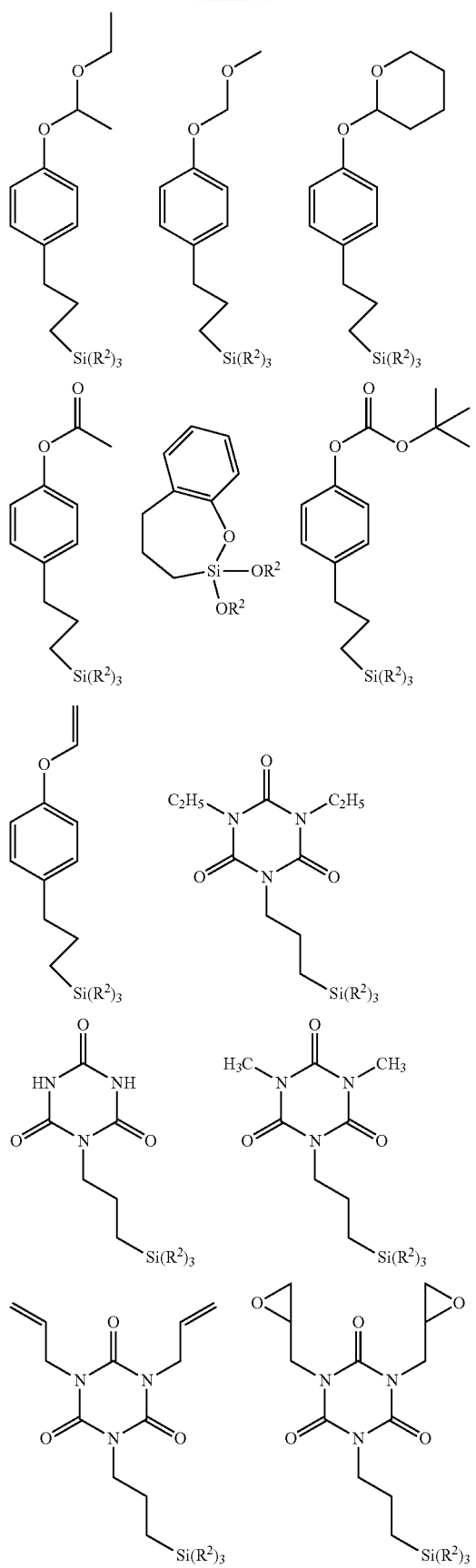
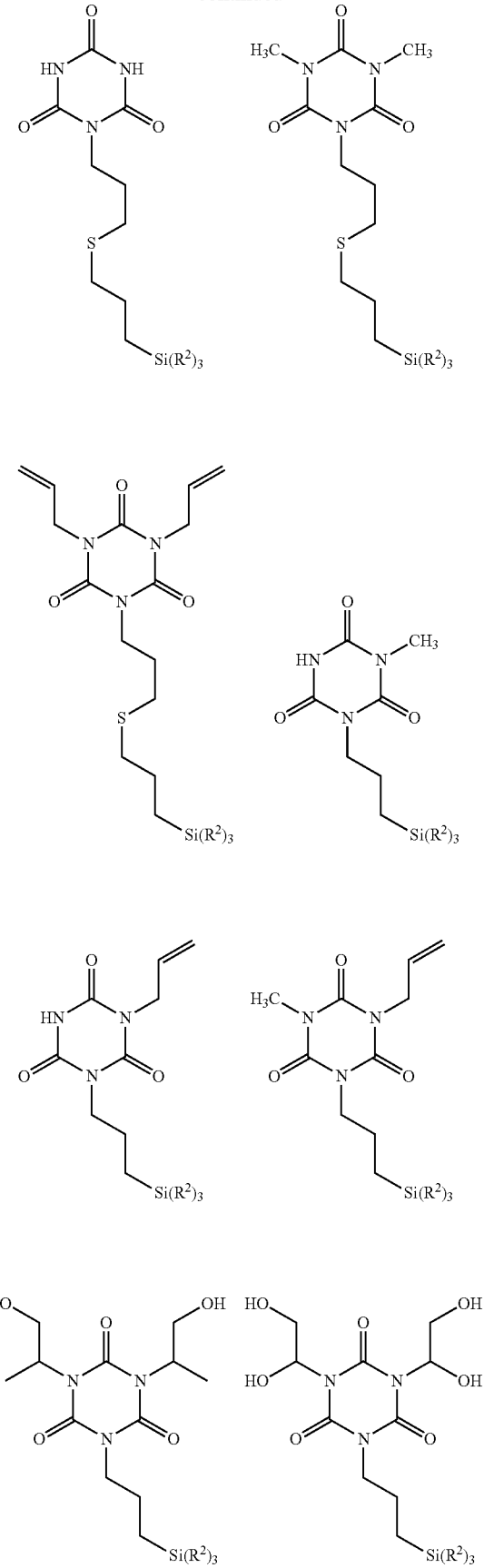

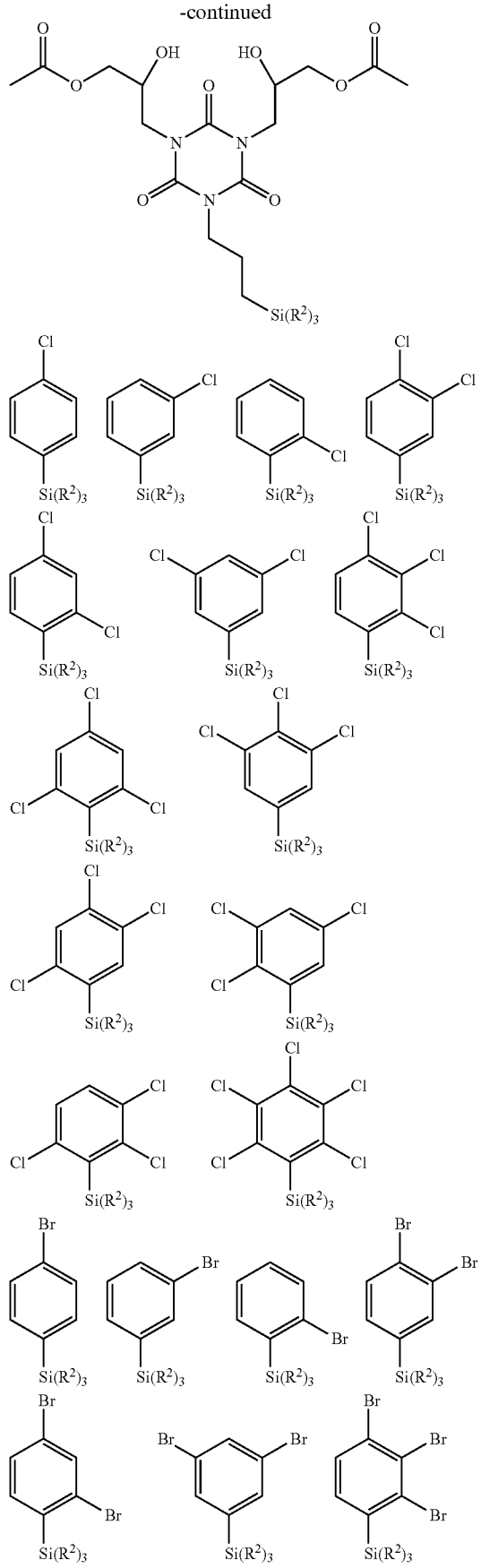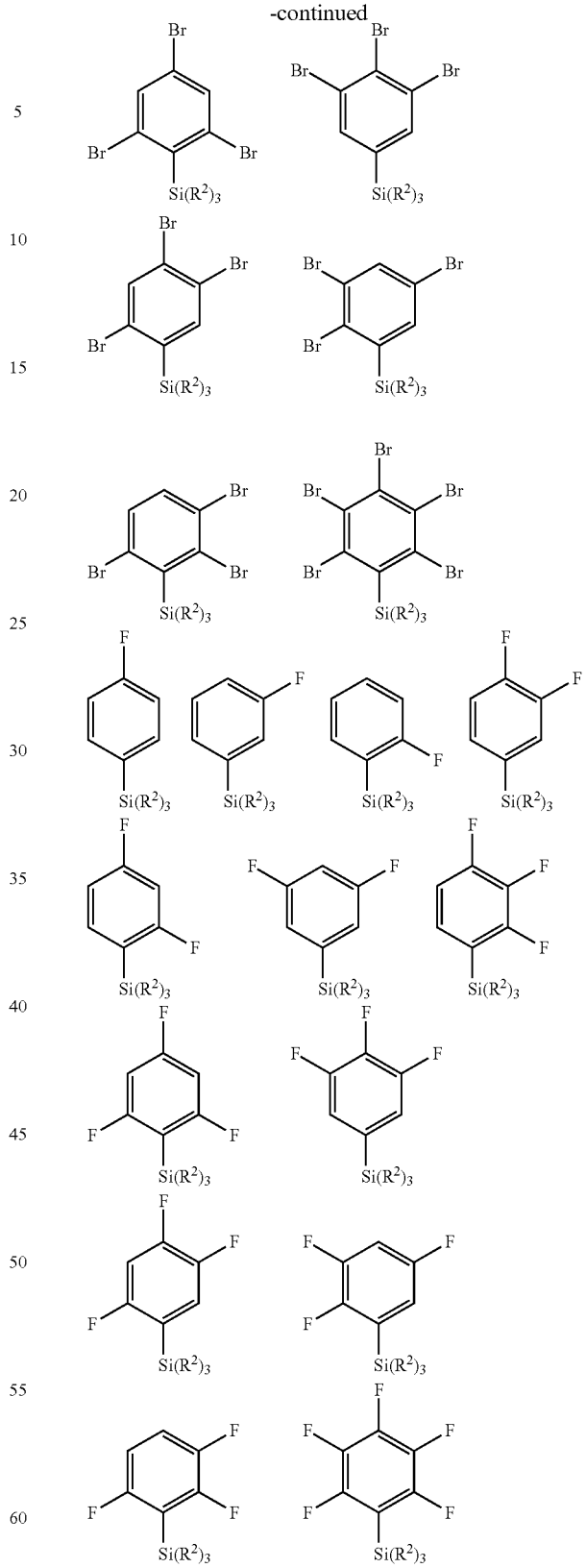
In the hydrolyzable organosilane of Formula (2), $R^3$ is an alkyl group; $R^4$ is an alkoxy group, an acyloxy group, or a halogen group; Y is an alkylene group or an arylene group; b is an integer of 0 or 1; and c is an integer of 0 or 1.

Examples of the alkyl group, the alkoxy group, the acyloxy group, and the halogen group include those described for Formula (1). Examples of the alkylene group and the arylene group include divalent organic groups that correspond to the alkyl groups and the aryl groups described above.

Examples of the hydrolyzable organosilane of Formula (2) include methylene bis trimethoxysilane, methylene bis trichlorosilane, methylene bis triacetoxysilane, ethylene bis triethoxysilane, ethylene bis trichlorosilane, ethylene bis triacetoxysilane, propylene bis triethoxysilane, butylene bis trimethoxysilane, phenylene bis trimethoxysilane, phenylene bis triethoxysilane, phenylene bis methyl diethoxysilane, phenylene bis methyl dimethoxysilane, naphthylene bis trimethoxysilane, bis trimethoxydisilane, bis triethoxy disilane, bis ethyl diethoxydisilane, and bis methyl dimethoxydisilane.

In the present invention, a hydrolyzed condensate of the hydrolyzable organosilane of Formula (1), or a hydrolyzed condensate of the hydrolyzable organosilane Formula (1) and the hydrolyzable organosilane of Formula (2) can be used.

In the present invention, the hydrolyzable organosilane of Formula (1) is preferably used.

Examples of the hydrolyzed condensate of the hydrolyzable organosilane used in the present invention are represented by the formulae below.

Formula (2-1)
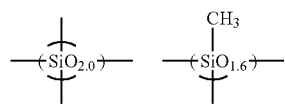

Formula (2-2)
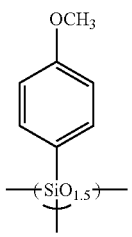

Formula (2-3)

Formula (2-4)
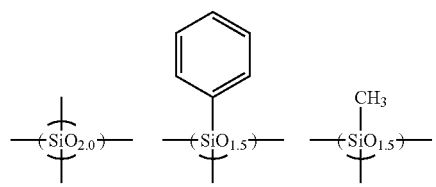

Formula (2-5)
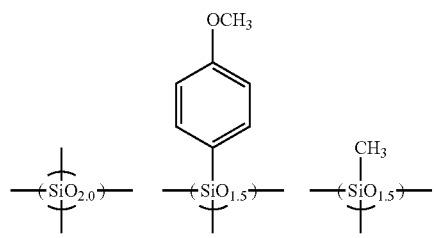

Formula (2-6)
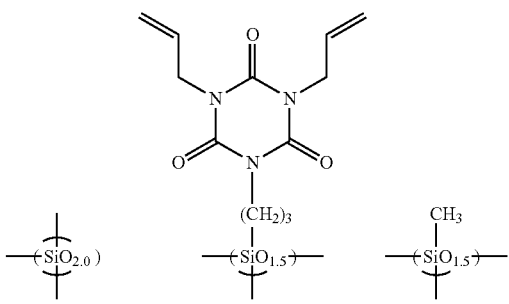

Formula (2-7)

Formula (2-8)
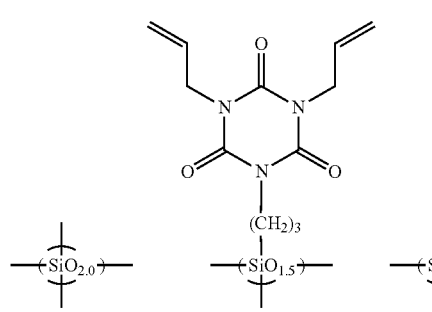

Formula (2-9)

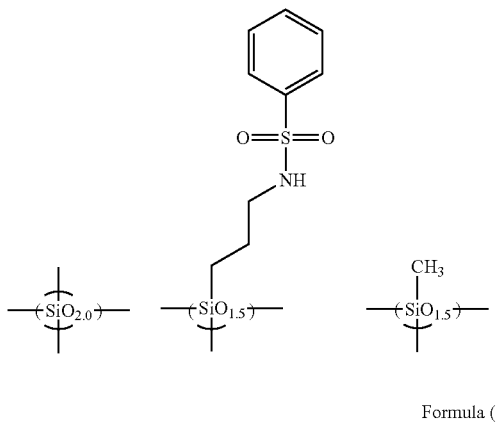

Formula (2-10)

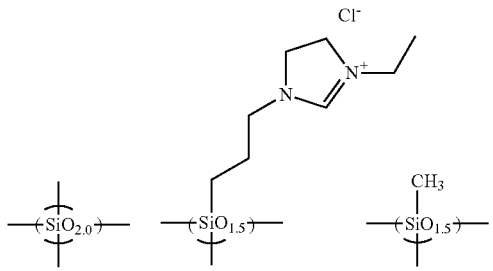

Formula (2-11)

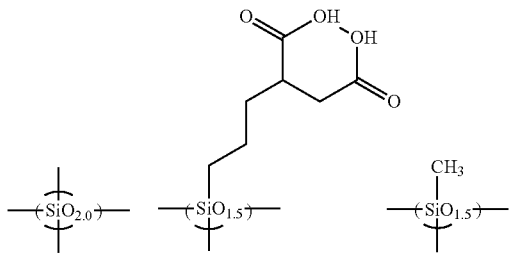

Formula (2-12)

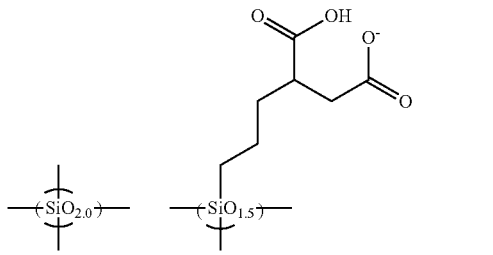

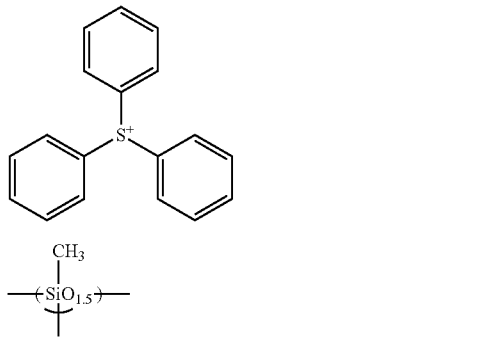

Formula (2-13)

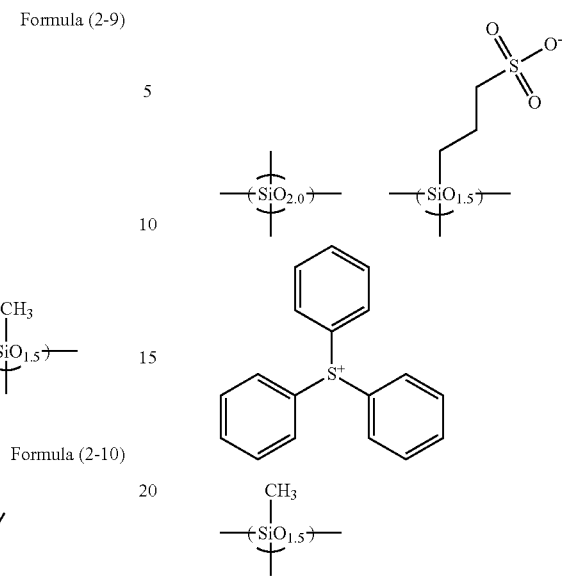

These are used preferably as hydrolyzed condensates (the polymers of polyorganosiloxanes), and the hydrolyzed condensate of the hydrolyzable organosilane of Formula (1) (the polymer of a polyorganosiloxane) is preferably used.

The hydrolyzed condensate of the hydrolyzable organosilane of Formula (1) (polyorganosiloxane), or the hydrolyzed condensate of the hydrolyzable organosilane Formula (1) and the hydrolyzable organosilane of Formula (2) (polyorganosiloxane) is a condensate having a weight-average molecular weight of 1,000 to 1,000,000, or 1,000 to 100,000. These molecular weights are determined by GPC analyses in terms of polystyrene.

Measuring conditions of GPC are, for example, GPC device (the product name: HLC-8220GPC, manufactured by Tosoh Corporation), GPC column (the product name: Shodex KF803L, KF802, and KF801, manufactured by Showa Denko K.K.), column temperature: 40° C., eluent (elution solvent):tetrahydrofuran, flux (a flow rate): 1.0 ml/min, and standard sample: polystyrene (manufactured by Showa Denko K.K.).

To hydrolyze an alkoxysilyl group, an acyloxysilyl group, or a halogenated silyl group, 0.5 to 100 mol, preferably 1 to 10 mol of water is used for 1 mol of a hydrolyzable group.

In addition, 0.001 to 10 mol, preferably 0.001 to 1 mol of a hydrolysis catalyst can be used for 1 mol of the hydrolyzable group.

A reaction temperature for hydrolysis and condensation is usually 20 to 80° C.

Hydrolysis may be complete or partial. That is, a hydrolysate, a monomer, and the like may remain in a hydrolyzed condensate.

Further, a catalyst can be used when hydrolysis and condensation are conducted.

Examples of the hydrolysis catalyst include a metal chelate compound, an organic acid, an inorganic acid, an organic base, and an inorganic base.

Examples of the metal chelate compound as the hydrolysis catalyst include titanium chelate compounds, such as triethoxy-mono(acetylacetonate)titanium, tri-n-propoxy-mono(acetylacetonate)titanium, tri-i-propoxy-mono(acetylacetonate)titanium, tri-n-butoxy-mono(acetylacetonate)titanium, tri-sec-butoxy-mono(acetylacetonate)titanium, tri-t- butoxy-mono(acetylacetonate)titanium, diethoxy-bis(acetylacetonate)titanium, di-n-propoxy-bis(acetylacetonate)titanium, di-i-propoxy-bis(acetylacetonate)titanium, di-n-butoxy-bis(acetylacetonate)titanium, di-sec-butoxy-bis(acetylacetonate)titanium, di-t-butoxy-bis(acetylacetonate)titanium, monoethoxy-tris(acetylacetonate)titanium, mono-n-propoxy-tris(acetylacetonate)titanium, mono-i-propoxy-tris(acetylacetonate)titanium, mono-n-butoxy-tris(acetylacetonate)titanium, mono-sec-butoxy-tris(acetylacetonate)titanium, mono-t-butoxy-tris(acetylacetonate)titanium, tetrakis(acetylacetonate)titanium, triethoxy-mono(ethyl acetoacetate)titanium, tri-n-propoxy-mono(ethyl acetoacetate)titanium, tri-i-propoxy-mono(ethyl acetoacetate)titanium, tri-n-butoxy-mono(ethyl acetoacetate)titanium, tri-sec-butoxy-mono(ethyl acetoacetate)titanium, tri-t-butoxy-mono(ethyl acetoacetate)titanium, diethoxy-bis(ethyl acetoacetate)titanium, di-n-propoxy-bis(ethyl acetoacetate)titanium, di-i-propoxy-bis(ethyl acetoacetate)titanium, di-n-butoxy-bis(ethyl acetoacetate)titanium, di-sec-butoxy-bis(ethyl acetoacetate)titanium, di-t-butoxy-bis(ethyl acetoacetate)titanium, monoethoxy-tris(ethyl acetoacetate)titanium, mono-n-propoxy-tris(ethyl acetoacetate)titanium, mono-i-propoxy-tris(ethyl acetoacetate)titanium, mono-n-butoxy-tris(ethyl acetoacetate)titanium, mono-sec-butoxy-tris(ethyl acetoacetate)titanium, mono-t-butoxy-tris(ethyl acetoacetate)titanium, tetrakis(ethyl acetoacetate)titanium, mono(acetylacetonate)tris(ethyl acetoacetate)titanium, bis(acetylacetonate)bis(ethyl acetoacetate)titanium, and tris(acetylacetonate)mono(ethyl acetoacetate)titanium; zirconium chelate compounds, such as triethoxy-mono(acetylacetonate)zirconium, tri-n-propoxy-mono(acetylacetonate)zirconium, tri-i-propoxy-mono(acetylacetonate)zirconium, tri-n-butoxy-mono(acetylacetonate)zirconium, tri-sec-butoxy-mono(acetylacetonate)zirconium, tri-t-butoxy-mono(acetylacetonate)zirconium, diethoxy-bis(acetylacetonate)zirconium, di-n-propoxy-bis(acetylacetonate)zirconium, di-i-propoxy-bis(acetylacetonate)zirconium, di-n-butoxy-bis(acetylacetonate)zirconium, di-sec-butoxy-bis(acetylacetonate)zirconium, di-t-butoxy-bis(acetylacetonate)zirconium, monoethoxy-tris(acetylacetonate)zirconium, mono-n-propoxy-tris(acetylacetonate)zirconium, mono-i-propoxy-tris(acetylacetonate)zirconium, mono-n-butoxy-tris(acetylacetonate)zirconium, mono-sec-butoxy-tris(acetylacetonate)zirconium, mono-t-butoxy-tris(acetylacetonate)zirconium, tetrakis(acetylacetonate)zirconium, triethoxy-mono(ethyl acetoacetate)zirconium, tri-n-propoxy-mono(ethyl acetoacetate)zirconium, tri-i-propoxy-mono(ethyl acetoacetate)zirconium, tri-n-butoxy-mono(ethyl acetoacetate)zirconium, tri-sec-butoxy-mono(ethyl acetoacetate)zirconium, tri-t-butoxy-mono(ethyl acetoacetate)zirconium, diethoxy-bis(ethyl acetoacetate)zirconium, di-n-propoxy-bis(ethyl acetoacetate)zirconium, di-i-propoxy-bis(ethyl acetoacetate)zirconium, di-n-butoxy-bis(ethyl acetoacetate)zirconium, di-sec-butoxy-bis(ethyl acetoacetate)zirconium, di-t-butoxy-bis(ethyl acetoacetate)zirconium, monoethoxy-tris(ethyl acetoacetate)zirconium, mono-n-propoxy-tris(ethyl acetoacetate)zirconium, mono-i-propoxy-tris(ethyl acetoacetate)zirconium, mono-n-butoxy-tris(ethyl acetoacetate)zirconium, mono-sec-butoxy-tris(ethyl acetoacetate)zirconium, mono-t-butoxy-tris(ethyl acetoacetate)zirconium, tetrakis (ethyl acetoacetate)zirconium, mono(acetylacetonate)tris(ethyl acetoacetate)zirconium, bis(acetylacetonate)bis(ethyl acetoacetate)zirconium, and tris(acetylacetonate)mono(ethyl acetoacetate)zirconium; and aluminum chelate compounds, such as tris(acetylacetonate)aluminum and tris(ethyl acetoacetate)aluminum.

Examples of the organic acid as the hydrolysis catalyst include acetic acid, propionic acid, butanoic acid, pentane acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid as the hydrolysis catalyst include hydrochloric acid, nitric acid, sulfuric acid, fluorinated acid, and phosphoric acid.

Examples of the organic base as the hydrolysis catalyst include pyridine, pyrrole, piperazine, pyrrolidine, piperidine, picoline, trimethylamine, triethylamine, monoethanolamine, diethanolamine, dimethyl monoethanolamine, monomethyl diethanolamine, triethanolamine, diazabicyclooctane, diazabicyclononane, diazabicycloundecene, and tetramethylammonium hydroxide. Examples of the inorganic base as the hydrolysis catalyst include ammonia, sodium hydroxide, potassium hydroxide, barium hydroxide, and calcium hydroxide. Among these catalysts, the metal chelate compound, the organic acid, and the inorganic acid are preferable, and these may be used alone, or two or more of them may be used at the same time.

Examples of an organic solvent used for hydrolysis include aliphatic hydrocarbon solvents, such as n-pentane, i-pentane, n-hexane, i-hexane, n-heptane, i-heptane, 2,2,4-trimethylpentane, n-octane, i-octane, cyclohexane, and methyl cyclohexane; aromatic hydrocarbon solvents, such as benzene, toluene, xylene, ethyl benzene, trimethyl benzene, methylethyl benzene, n-propyl benzene, i-propyl benzene, diethyl benzene, i-butyl benzene, triethyl benzene, di-i-propyl benzene, n-amyl naphthalene, and trimethyl benzene; monoalcohol solvents, such as methanol, ethanol, n-propanol, i-propanol, n-butanol, i-butanol, sec-butanol, t-butanol, n-pentanol, i-pentanol, 2-methyl butanol, sec-pentanol, t-pentanol, 3-methoxy butanol, n-hexanol, 2-methyl pentanol, sec-hexanol, 2-ethyl butanol, sec-heptanol, heptanol-3, n-octanol, 2-ethyl hexanol, sec-octanol, n-nonyl alcohol, 2,6-dimethyl heptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethyl carbinol, diacetone alcohol, and cresol; polyhydric alcohol solvents, such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerin; ketone solvents, such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethyl nonanone, cyclohexanone, methylcyclohexanone, 2,4-pentanedione, acetonyl acetone, diacetone alcohol, acetophenone, and fenchone; ether solvents, such as ethyl ether, i-propyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyl tetrahydrofuran; ester solvents, such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxy butyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methyl formamide, N,N-dimethyl formamide, N,N-diethyl formamide, acetamide, N-methyl acetamide, N,N-dimethyl acetamide, N-methyl propionamide, and N-methyl pyrrolidone; and sulfur-containing solvents, such as dimethyl sulfide, diethyl sulfide, thiophene, tetrahydro thiophene, dimethyl sulfoxide, sulfolane, and 1,3-propane sultone. These solvents may be used alone, or two or more of them may be used in combination.

In particular, ketone solvents, such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethyl nonanone, cyclohexanone, methyl cyclohexanone, 2,4-pentanedione, acetonyl acetone, diacetone alcohol, acetophenone, and fenchone(1,1,3-trimethyl-2-norbornene) are preferable in terms of storage stability.

A hydrolyzed condensate (polymer) can be obtained by hydrolyzing and condensing a hydrolyzable organo silane in a solvent with a catalyst. An alcohol that is a byproduct, a hydrolysis catalyst used, water, and the like can be removed at the same time by vacuum distillation or the like. An acid catalyst or a base catalyst used for hydrolysis can be removed by neutralization, ion exchange, and the like. For stabilization, the resist underlayer film-forming composition for lithography of the present invention, which contains the hydrolyzed condensate of the composition, may contain an acid (for example, an organic acid), water, an alcohol, or a combination thereof.

Examples of the organic acid include oxalic acid, malonic acid, methyl malonic acid, succinic acid, maleic acid, malic acid, tartaric acid, phthalic acid, citric acid, glutaric acid, citric acid, lactic acid, and salicylic acid. Among them, oxalic acid and maleic acid are preferable. 0.5 part by mass to 5.0 parts by mass of the organic acid is added with respect to 100 parts by mass of the condensate (polyorganosiloxane). As water to be added, pure water, ultrapure water, ion exchanged water, or the like can be used, and the addition amount thereof can be 1 part by mass to 20 parts by mass with respect to 100 parts by mass of the resist underlayer film-forming composition.

The alcohol to be added is preferably easily scattered upon heating after coating is preferably added, and examples thereof include methanol, ethanol, propanol, isopropanol, and butanol. 1 part by mass to 20 parts by mass of the alcohol can be added with respect to 100 parts by mass of the resist underlayer film-forming composition.

The present invention further includes a salt of a sulfonic acid ion containing a hydrocarbon group with an onium ion. A sulfonium ion, an ammonium ion, an iodonium ion, a phosphonium ion, or an oxonium ion can be used as the onium ion.

The onium ion contains at least one organic group having an aromatic ring. Preferred examples of the onium ion are represented by the formulae below.

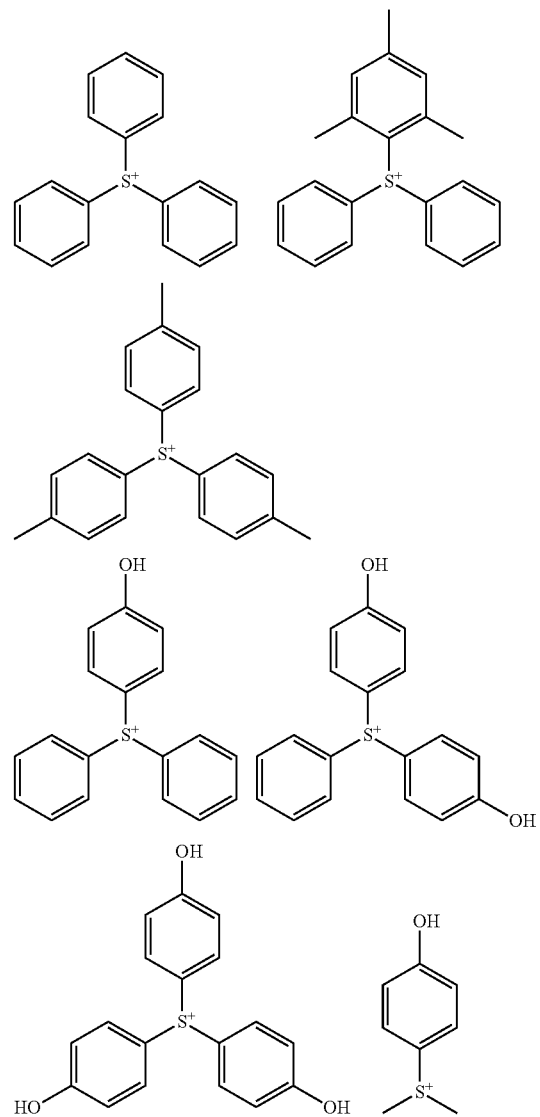

25
-continued
26
-continued
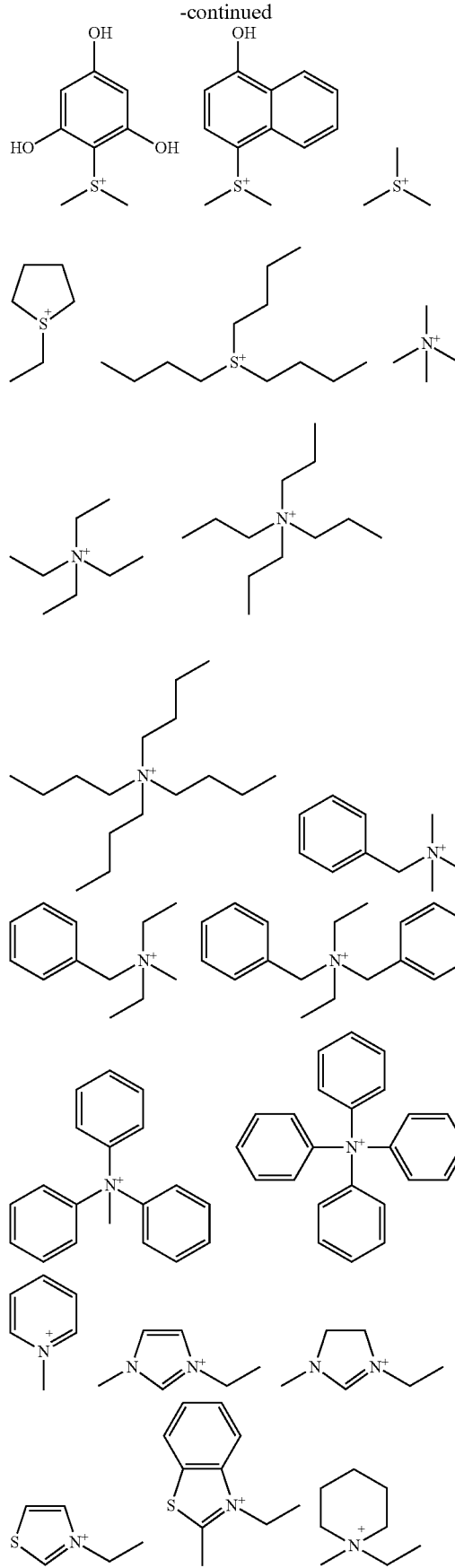
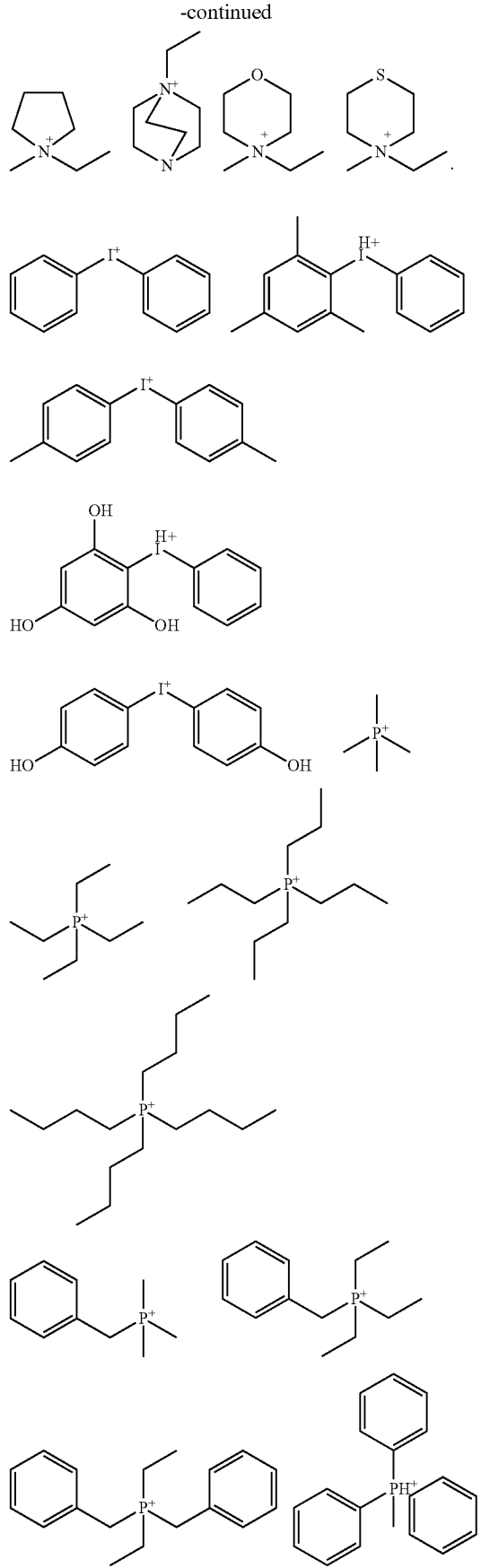

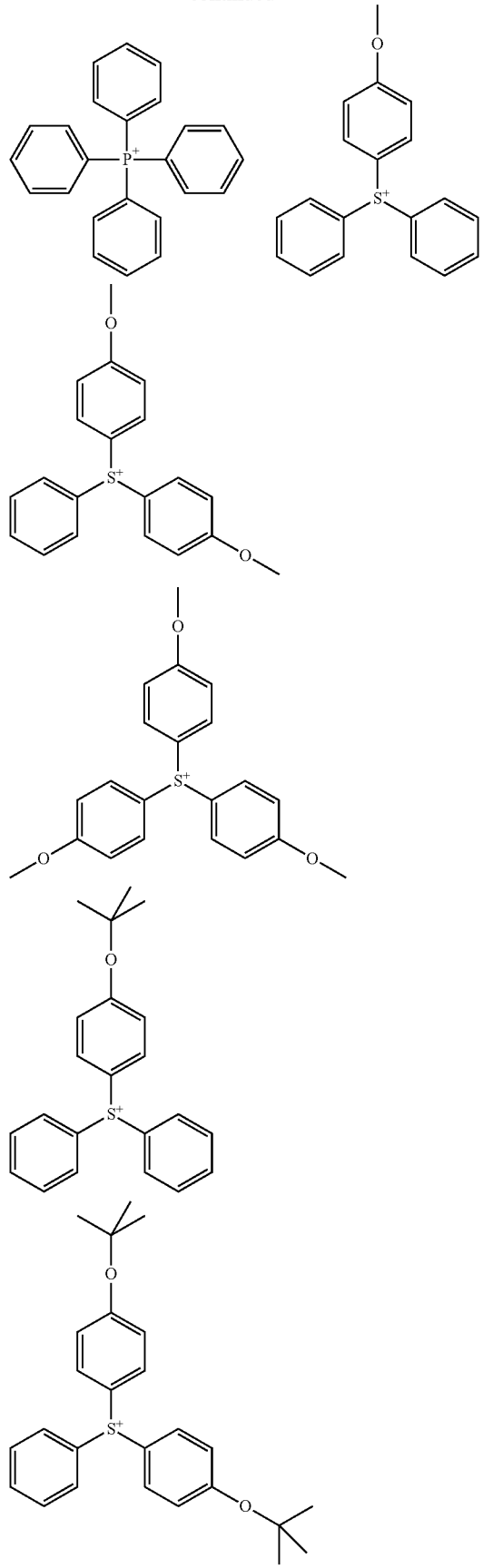
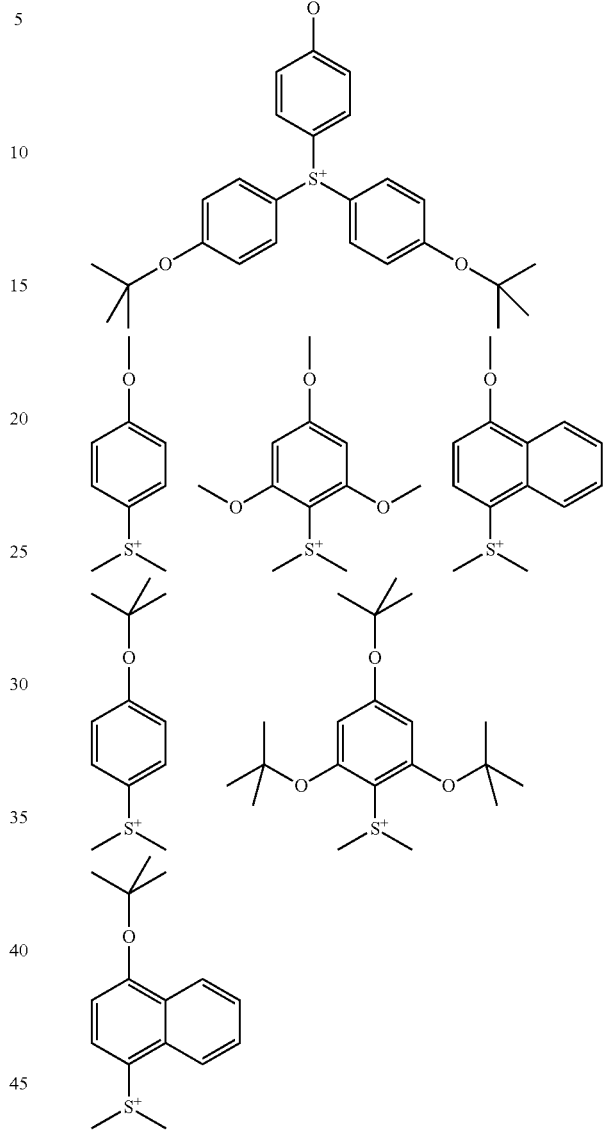

In the sulfonic acid ion containing a hydrocarbon group, a portion of the hydrocarbon group is optionally substituted. The hydrocarbon group contains a bond between carbon and hydrogen, and thus a portion of the bond between carbon and hydrogen can be substituted with a halogen atom, such as fluorine; however, it is not preferable if the bond is completely substituted with a halogen atom, such as fluorine. Examples of the hydrocarbon group include a $C_{1-20}$ alkyl group and an aryl group, and specific examples thereof include linear alkyl groups, such as a methyl group, an ethyl group, a propyl group, and a dodecyl group; cyclic alkyl groups, such as a cyclohexyl group; a phenyl group; and a combination of a linear group and a cyclic group. When $R^1$ in Formula (1) is a salt of a sulfonic acid ion containing a hydrocarbon group with an onium ion, the hydrocarbon group of above is a divalent organic group corresponding to the hydrocarbon group.

Preferred examples of the sulfonic acid ion containing a hydrocarbon group, or examples of the sulfonic acid ion containing a hydrocarbon group, in which a portion of the hydrocarbon group is optionally substituted, are represented by the formulae below.

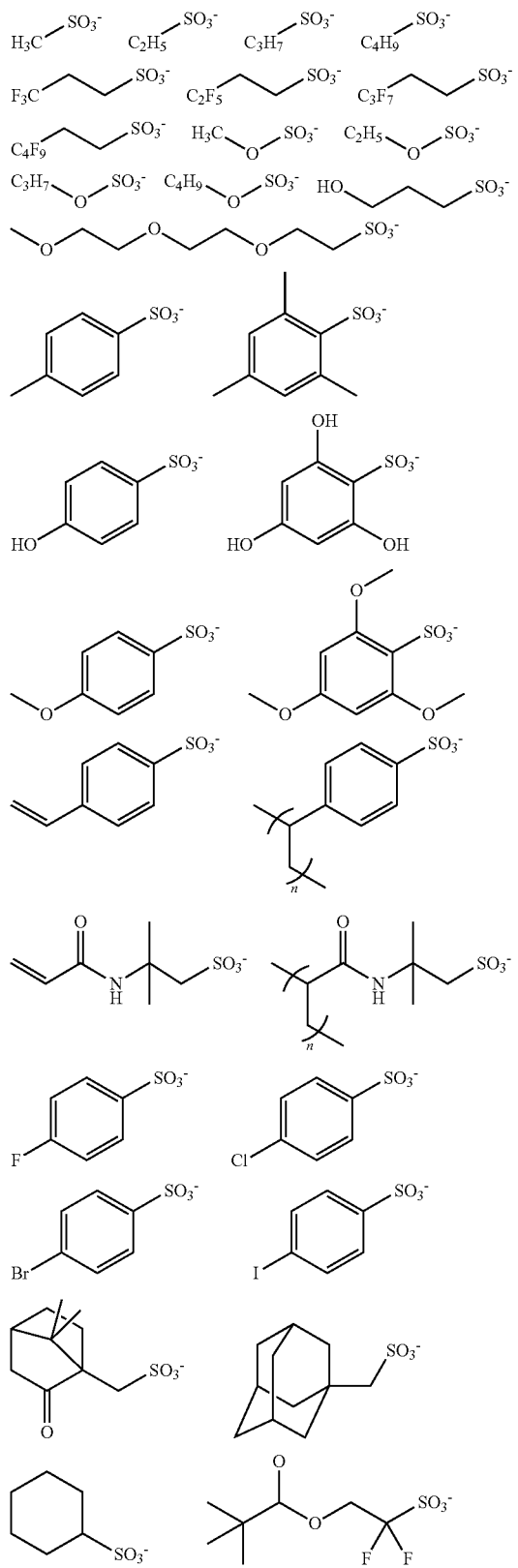

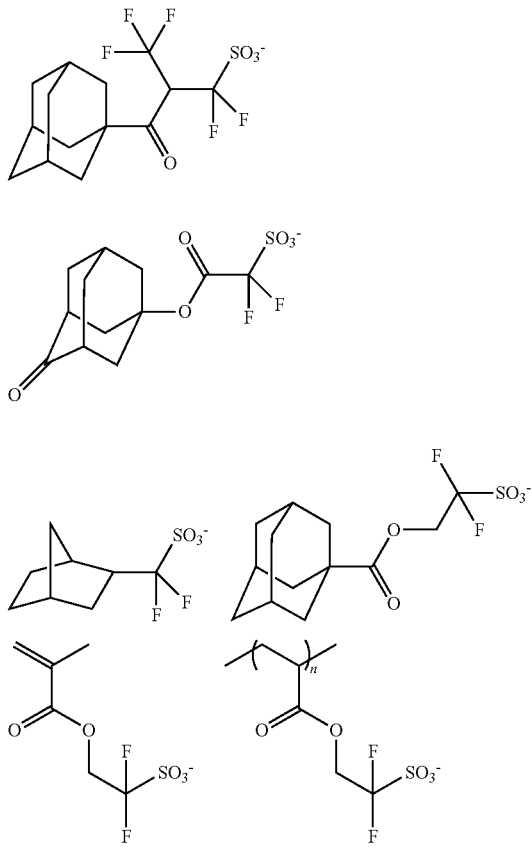

(In the formula, n is 1 to 1,000.)

Further, bisphenol S or a derivative of bisphenol S can be added as an additive. To 100 parts by mass of polyorganosiloxane, 0.01 part by mass to 20 parts by mass, or 0.01 part by mass to 10 parts by mass, or 0.01 part by mass to 5 parts by mass of the bisphenol S or the derivative of bisphenol S is added.

Preferred examples of the bisphenol S or those of the derivative of bisphenol S are represented by the formulae below.

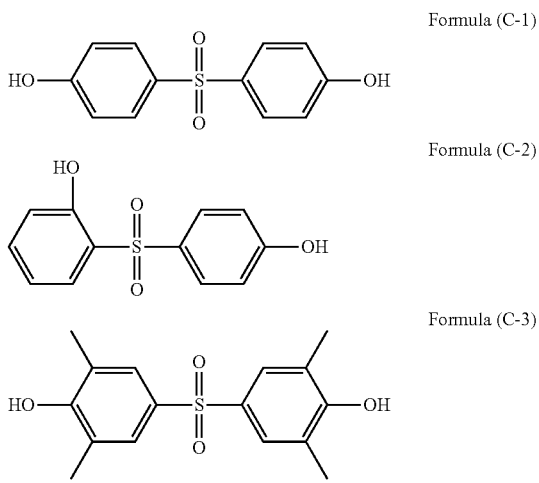

-continued
Formula (C-4)
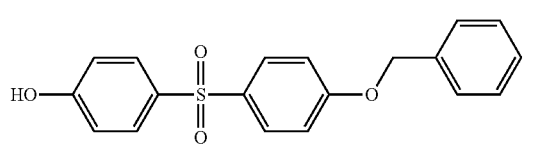
Formula (C-5)
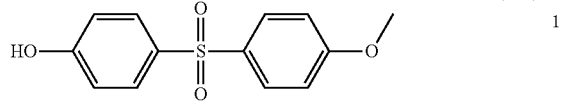
Formula (C-6)
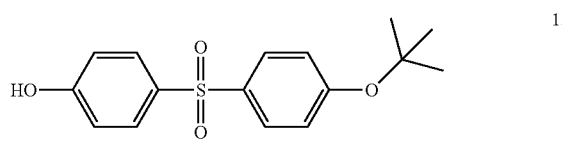
Formula (C-7)
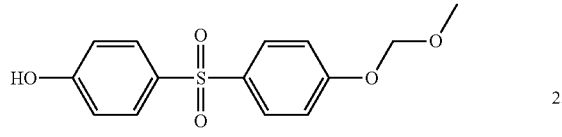
Formula (C-8)
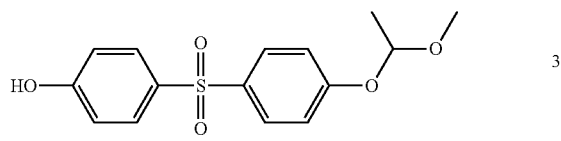
Formula (C-9)
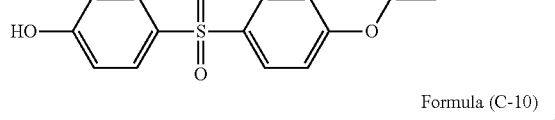
Formula (C-10)
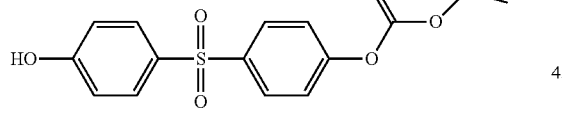
Formula (C-11)
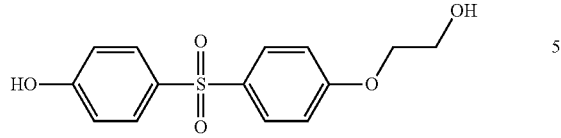
Formula (C-12)
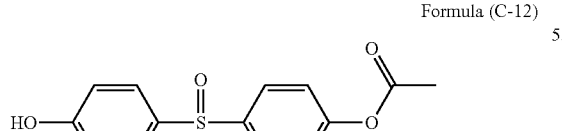
Formula (C-13)
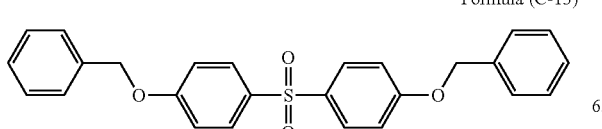
Formula (C-14)
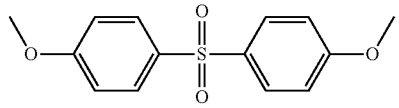
Formula (C-15)
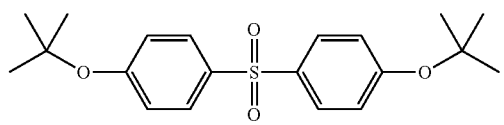
Formula (C-16)
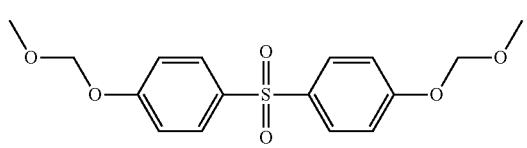
Formula (C-17)
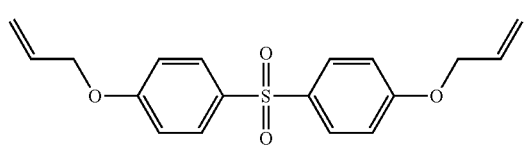
Formula (C-18)
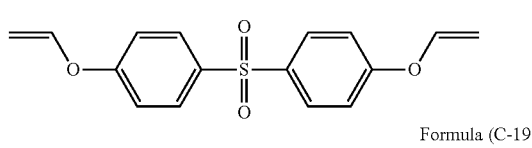
Formula (C-19)
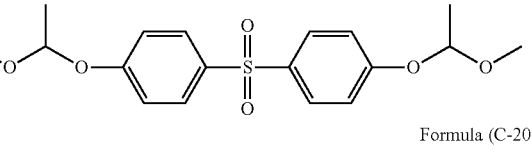
Formula (C-20)
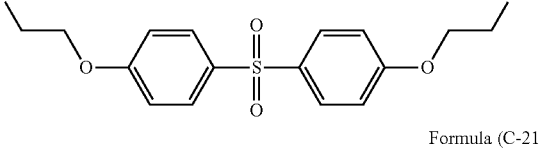
Formula (C-21)
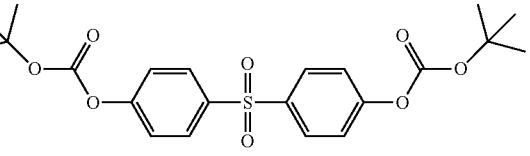
Formula (C-22)
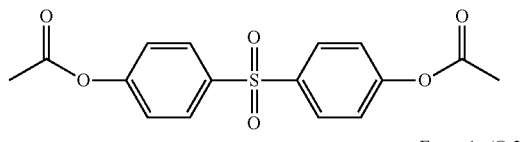
Formula (C-23)
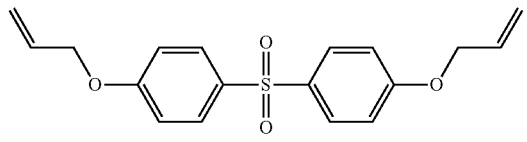
The resist underlayer film-forming composition of the present invention may contain a curing catalyst. The curing catalyst works when a coating film containing polyorganosiloxane composed of the hydrolyzed condensate is heated and cured.

As the curing catalyst, an ammonium salt, a phosphine, a phosphonium salt, and a sulfonium salt can be used.

Examples of the ammonium salt include a quaternary ammonium salt having a structure of Formula (D-1):

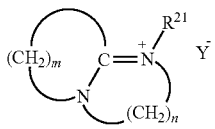
Formula (D-1)

(in the formula, m is an integer of 2 to 11; n is an integer of 2 or 3; $R^{21}$ is an alkyl group or an aryl group; and $Y^-$ is an anion);
a quaternary ammonium salt having a structure of Formula (D-2):

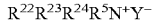
Formula (D-2)

(in the formula, each of $R^{22}$, $R^{23}$, $R^{24}$, and $R^5$ is an alkyl group or an aryl group; N is a nitrogen atom; and $Y^-$ is an anion; and each of $R^{22}$, $R^{23}$, $R^{24}$, and $R^5$ is bonded to a nitrogen atom with a C—N bond);
a quaternary ammonium salt having a structure of Formula (D-3):

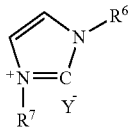
Formula (D-3)

(in the formula, each of $R^6$ and $R^7$ is an alkyl group or an aryl group; and $Y^-$ is an anion); a quaternary ammonium salt having a structure of Formula (D-4):

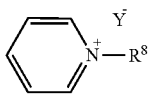
Formula (D-4)

(in the formula, $R^8$ is an alkyl group or an aryl group; and $Y^-$ is an anion);
a quaternary ammonium salt having a structure of Formula (D-5):

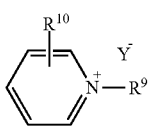
Formula (D-5)

(in the formula, each of $R^9$ and $R^{10}$ is an alkyl group or an aryl group; and $Y^-$ is an anion); and
a tertiary ammonium salt having a structure of Formula (D-6):

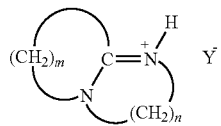
Formula (D-6)

(in the formula, m is an integer of 2 to 11; n is an integer of 2 or 3; H is a hydrogen atom; and $Y^-$ is an anion).

Examples of the phosphonium salt include a quaternary phosphonium salt having a structure of Formula (D-7):

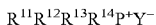
Formula (D-7)

(in the formula, each of $R^{11}$, $R^{12}$, $R^{13}$, and $R^{14}$ is an alkyl group or an aryl group; P is a phosphorus atom; and $Y^-$ is an anion; and each of $R^{11}$, $R^{12}$, $R^{13}$, and $R^{14}$ is bonded to a phosphorus atom with a C—P bond).

Examples of the sulfonium salt include a tertiary sulfonium salt having a structure of Formula (D-8):

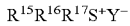
Formula (D-8)

(in the formula, each of $R^{15}$, $R^{16}$, and $R^{17}$ is an alkyl group or an aryl group; S is a sulfur atom; and $Y^-$ is an anion; and each of $R^{15}$, $R^{16}$, and $R^{17}$ is bonded to a sulfur atom with a C—S bond).

The compound of Formula (D-1) above is a quaternary ammonium salt derived from an amine, in which m is an integer of 2 to 11, and n is an integer of 2 or 3. $R^{21}$ in the quaternary ammonium salt is a $C_{1-18}$, preferably $C_{2-10}$ alkyl group or an aryl group, and examples thereof include linear alkyl groups, such as an ethyl group, a propyl group, and a butyl group; a benzyl group, a cyclohexyl group, a cyclohexylmethyl group, and dicyclopentadienyl group. Examples of the anion ($Y^-$) include halogen ions, such as a chlorine ion ($Cl^-$), a bromine ion ($Br^-$), and an iodine ion ($I^-$); and acid groups, such as carboxylate (—COO—), alcoholate (—O—), and a nitric acid ion ($NO_3^-$).

The compound of Formula (D-2) above is a quaternary ammonium salt of $R^{22}R^{23}R^{24}R^5N^+Y^-$. Each of $R^{22}$, $R^{23}$, $R^{24}$, and $R^5$ in the formula representing the quaternary ammonium salt is a $C_{1-18}$ alkyl group or an aryl group, or a silane compound bonded to a silicon atom with a Si—C bond, Examples of the anion ($Y^-$) include a halogen ions, such as a chlorine ion ($Cl^-$), a bromine ion ($Br^-$), and an iodine ion ($I^-$); and acid groups, such as carboxylate (—COO—), alcoholate (—O—), and a nitric acid ion ($NO_3^-$). The quaternary ammonium salt is commercially available, and examples thereof include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride. The compound of Formula (D-2) can be added as an ammonium compound.

The compound of Formula (D-3) above is a quaternary ammonium salt derived from 1-substituted imidazole, in which each of $R^6$ and $R^7$ is $C_{1-18}$ and the total number of carbon atoms of $R^6$ and $R^7$ is preferably seven or more. For example, $R^6$ is a methyl group, an ethyl group, a propyl group, a phenyl group, a benzyl group, a silane compound bonded to a silicon atom with a Si—C bond, or a combination thereof; and $R^7$ is a benzyl group, an octyl group, or an octadecyl group. Examples of the anion ($Y^-$) include a halogen ions, such as a chlorine ion ($Cl^-$), a bromine ion ($Br^-$), and an iodine ion ($I^-$); and acid groups, such as carboxylate (—COO—), alcoholate (—O—), and a nitric acid ion ($NO_3^-$). Although the compound is commercially available, it can be manufactured by, for example, allowing an imidazole compound such as 1-methyl imidazole and 1-benzyl imidazole to react with a halogenated alkyl such as benzyl bromide and methyl bromide, or with a halogenated aryl. A 4,5-dihydroimidazole compound having hydrogenated positions 4 and 5 can be used as the compound of Formula (D-3). The compound of Formula (D-3) can be added as a cyclic ammonium compound.

The compound of Formula (D-4) above is a quaternary ammonium salt derived from pyridine, in which $R^8$ is a $C_{1-18}$, preferably $C_{4-18}$ alkyl group or an aryl group, and examples thereof include a butyl group, an octyl group, a benzyl group, and a lauryl group. Examples of the anion ($Y^-$) include a halogen ions, such as a chlorine ion ($Cl^-$), a bromine ion ($Br^-$), and an iodine ion ($I^-$); and acid groups, such as carboxylate (—COO—), alcoholate (—O—), and a nitric acid ion ($NO_3^-$). Although the compound is commercially available, it can be manufactured by, for example, allowing pyridine to react with a halogenated alkyl such as lauryl chloride, benzyl chloride, benzyl bromide, methyl bromide, and octyl bromide, or with a halogenated aryl. Examples of the compound include N-lauryl pyridinium chloride and N-benzyl pyridinium bromide.

The compound of Formula (D-5) above is a quaternary ammonium salt derived from a substituted pyridine, such as picoline, in which $R^9$ is a $C_{1-18}$, preferably $C_{4-18}$ alkyl group or an aryl group, and examples thereof include a methyl group, an octyl group, a lauryl group, and a benzyl group. $R^{10}$ is a $C_{1-18}$ alkyl group or an aryl group, and for example, when the compound is a quaternary ammonium derived from picoline, $R^{10}$ is a methyl group. Examples of the anion ($Y^-$) include a halogen ions, such as a chlorine ion ($Cl^-$), a bromine ion ($Br^-$), and an iodine ion ($I^-$); and acid groups, such as carboxylate (—COO—), alcoholate (—O—), and a nitric acid ion ($NO_3^-$). Although the compound is commercially available, it can be manufactured by, for example, allowing a substituted pyridine such as picoline to react with a halogenated alkyl such as methyl bromide, octyl bromide, lauryl chloride, benzyl chloride, and benzyl bromide, or with a halogenated aryl. Examples of the compound include N-benzyl picolinium chloride, N-benzyl picolinium bromide, and N-lauryl picolinium chloride.

The compound of Formula (D-6) above is a tertiary ammonium salt derived from an amine, in which m is an integer of 2 to 11, and n is an integer of 2 or 3. Examples of the anion ($Y^-$) include a halogen ions, such as a chlorine ion ($Cl^-$), a bromine ion ($Br^-$), and an iodine ion ($I^-$); and acid groups, such as carboxylate (—COO—), alcoholate (—O—), and a nitric acid ion ($NO_3^-$). The compound can be manufactured by allowing an amine to react with a weak acid such as a carboxylic acid and phenol. Examples of the carboxylic acid include formic acid and acetic acid, and when formic acid is used, the anion ($Y^-$) is ($HCOO^-$), and when acetic acid is used, the anion ($Y^-$) is ($CH_3COO^-$). When phenol is used, the anion ($Y^-$) is ($C_6H_5O^-$).

The compound of Formula (D-7) above is a quaternary phosphonium salt having a structure of $R^{11}R^{12}R^{13}R^{14}P^+Y^-$. Each of $R^{11}$, $R^{12}$, $R^{13}$, and $R^{14}$ is a $C_{1-18}$ alkyl group or an aryl group, or a silane compound bonded to a silicon atom with a Si—C bond. Preferably, tree of the four substituents $R^{11}$ to $R^{14}$ are each a phenyl group or a substituted phenyl group, and examples thereof include a phenyl group and a tolyl group. The remaining one substituent is a $C_{1-18}$ alkyl group, an aryl group, or a silane compound bonded to a silicon atom with a Si—C bond. Examples of the anion ($Y^-$) include halogen ions, such as a chlorine ion ($Cl^-$), a bromine ion ($Br^-$), and an iodine ion ($I^-$); and acid groups, such as carboxylate (—COO—), alcoholate (—O—), and a nitric acid ion ($NO_3^-$).

The compound is commercially available, and examples thereof include halogenated tetraalkylphosphoniums, such as halogenated tetra n-butylphosphonium and halogenated tetra n-propylphosphonium; halogenated trialkylbenzylphosphoniums, such as halogenated triethylbenzylphosphonium; halogenated triphenyl monoalkylphosphoniums, such as halogenated triphenylmethylphosphonium and halogenated triphenylethylphosphonium; halogenated triphenylbenzylphosphonium; halogenated tetraphenylphosphonium; a halogenated tritolyl monoarylphosphonium; and a halogenated tritolyl monoalkylphosphonium (in which, a halogen atom is a chlorine atom or a bromine atom). In particular, halogenated triphenyl monoalkylphosphoniums, such as halogenated triphenylmethylphosphonium and halogenated triphenylethylphosphonium; halogenated triphenyl monoarylphosphoniums, such as halogenated triphenylbenzylphosphonium; halogenated tritolyl monoarylphosphoniums, such as halogenated tritolyl monophenylphosphonium; and halogenated tritolyl monoalkylphosphoniums (in which, a halogen atom is a chlorine atom or a bromine atom), such as halogenated tritolyl monomethylphosphonium are preferable.

Examples of the phosphine include primary phosphines, such as methylphosphine, ethylphosphine, propylphosphine, isopropylphosphine, isobutylphosphine, and phenylphosphine; secondary phosphines, such as dimethylphosphine, diethylphosphine, diisopropylphosphine, diisoamylphosphine, and diphenylphosphine; and tertiary phosphines, such as trimethylphosphine, triethylphosphine, triphenylphosphine, methyldiphenylphosphine, and dimethylphenylphosphine.

The compound of Formula (D-8) above is a tertiary sulfonium salt having a structure of $R^{15}R^{16}R^{17}S^+Y^-$. Each of $R^{15}$, $R^{16}$, and $R^{17}$ is a $C_{1-18}$ alkyl group or an aryl group, or a silane compound bonded to a silicon atom with a Si—C bond. Preferably, three of the four substituents $R^{15}$ to $R^{17}$ are each a phenyl group or a substituted phenyl group, and examples thereof include a phenyl group and a tolyl group. The remaining one substituent is an optionally substituted $C_{1-18}$ alkyl group, or an aryl group. Examples of the anion ($Y^-$) include a halogen ions, such as a chlorine ion ($Cl^-$), a bromine ion ($Br^-$), and an iodine ion ($I^-$); and acid groups, such as carboxylate (—COO—), alcoholate (—O—), and a nitric acid ion ($NO_3^-$). The compound is commercially available, and examples thereof include halogenated tetraalkylphosphoniums, such as halogenated tri n-butylsulfonium, halogenated tri n-propylsulfonium; halogenated trialkylbenzylsulfoniums, such as halogenated diethylbenzylsulfonium; halogenated diphenyl monoalkylsulfoniums, such as halogenated diphenylmethylsulfonium and halogenated diphenylethylsulfonium; halogenated triphenylsulfoniums, (in which, a halogen atom is a chlorine atom or a bromine atom); tetraalkylphosphonium carboxylates, such as tri n-butylsulfonium carboxylate and tri n-propylsulfonium carboxylate; trialkylbenzylsulfonium carboxylates, such as diethylbenzylsulfonium carboxylate; diphenyl monoalkyl sulfonium carboxylates, such as diphenylmethylsulfonium carboxylate and diphenylethylsulfonium carboxylate; and triphenylsulfonium carboxylates. In particular, halogenated triphenylsulfoniums and triphenylsulfonium carboxylates are preferable.

To 100 parts by mass of polyorganosiloxane, 0.01 part by mass to 10 parts by mass, or 0.01 part by mass to 5 parts by mass, or 0.01 part by mass to 3 parts by mass of the curing catalyst is added.

If desired, the underlayer film-forming composition for lithography of the present invention can further comprise an organic polymer compound, a photo acid generator, a surfactant, and the like, in addition to the components described above.

By using an organic polymer compound, a dry etching rate (a decreasing amount of the film thickness per unit time), an attenuation coefficient, and a refractive index of a resist underlayer film formed with the underlayer film-forming composition for lithography of the present invention can be adjusted.

The organic polymer compound is not particularly limited, and a variety of organic polymers can be used. A condensation polymerization polymer and an addition polymerization polymer can also be used as the organic polymer compound. Examples of the addition polymerization polymer and the condensation polymerization polymer include polyester, polystyrene, polyimide, an acrylic polymer, a methacrylic polymer, polyvinyl ether, phenol novolac, naphthol novolac, polyether, polyamide, and polycarbonate. An organic polymer having an aromatic ring structure that works as an absorptive portion, such as a benzene ring, a naphthalene ring, an anthracene ring, a triazine ring, a quinoline ring, and a quinoxaline ring, is preferably used.

Examples of the organic polymer compound include an addition polymerization polymer having an addition polymerization monomer, such as benzyl acrylate, benzyl methacrylate, phenyl acrylate, naphthyl acrylate, anthryl methacrylate, anthrylmethyl methacrylate, styrene, hydroxy styrene, benzylvinyl ether, and N-phenyl maleimide, as a structural unit thereof; and a condensation polymerization polymer such as phenol novolac and naphthol novolac.

In the case where the addition polymerization polymer is used as the organic polymer compound, the polymer may be a homopolymer or a copolymer. Addition polymerization monomers are used for manufacturing an addition polymerization polymer. Examples of the addition polymerization monomer include acrylic acid, methacrylic acid, an acrylic acid ester compound, a methacrylic acid ester compound, an acrylamide compound, a methacrylamide compound, a vinyl compound, a styrene compound, a maleimide compound, maleic acid anhydride, and acrylonitrile.

In the case where the organic polymer compound is used, the percentage thereof is 1 part by mass to 200 parts by mass, or 5 parts by mass to 100 parts by mass, or 10 parts by mass to 50 parts by mass, or 20 parts by mass to 30 parts by mass, with respect to 100 parts by mass of the condensate (polyorganosiloxane).

A crosslinkable compound can be contained in the present invention. As the crosslinking agent, a crosslinkable compound having at least two cross-linking substituents is preferably used. Examples of the crosslinkable compound include melamine compounds having cross-linking substituents, such as a methylol group and a methoxymethyl group, and substituted urea compounds. Specific examples of the crosslinkable compound include compounds such as a methoxymethylated glycoluril and a methoxymethylated melamine, and examples thereof include tetramethoxymethyl glycoluril, tetrabutoxymethyl glycoluril, and hexamethoxymethyl melamine. The examples further include compounds such as tetramethoxymethyl urea and tetrabutoxymethyl urea. The content of the cross-linker in the solid content is, for example, 50% by mass or less, 0.01% by mass to 50% by mass, or 10% by mass to 40% by mass.

An acid compound can be contained in the resist underlayer film-forming composition of the present invention. Examples of the acid compound include sulfonic acid compounds, such as p-toluenesulfonic acid, trifluoromethanesulfonic acid, and pyridinium-p-toluene sulfonate; and carboxylic acid compounds, such as salicylic acid, sulfosalicylic acid, citric acid, benzoic acid, and hydroxybenzoic acid. Examples of the acid compound further include acid generators that generate acids with heat or light, such as 2,4,4,6-tetrabromo cyclohexadienone, benzoin tosylate, 2-nitrobenzyl tosylate, p-trifluoromethyl benzenesulfonic acid-2,4-dinitrobenzyl, and phenyl-bis(trichloromethyl)-s-triazine. Examples of the acid compound still further include iodonium salt acid generators, such as diphenyliodonium hexafluorophosphate. As the acid compound, an iodonium salt acid generator is preferable.

The photo acid generators may be used alone, or two or more of them may be used in combination.

In the case where the photo acid generator is used, the percentage thereof is 0.01 part by mass to 15 parts by mass, or 0.1 part by mass to 10 parts by mass, or 0.5 part by mass to 5 parts by mass, with respect to 100 parts by mass of the condensate (polyorganosiloxane).

The use of a surfactant is effective in avoiding generation of, for example, any pinholes and striation when a substrate is coated with the resist underlayer film-forming composition for lithography of the present invention.

Examples of the surfactant contained in the resist underlayer film-forming composition of the present invention include nonionic surfactants including polyoxyethylene alkylethers, such as polyoxyethylene lauryl ether, polyoxyethylene stearyl ether, polyoxyethylene cetyl ether, and polyoxyethylene oleyl ether; polyoxyethylene alkylallylethers, such as polyoxyethylene octyl phenol ether and polyoxyethylene nonyl phenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants including the product name: Eftop EF301, EF303, and EF352 (manufactured by Tohkem Products Co., Ltd.), the product name: MEGAFAC F171, F173, R-08, and R-30 (manufactured by Dainippon Ink and Chemicals, Incorporated), Fluorad FC430 and FC431 (manufactured by Sumitomo 3M Limited), and the product name: AsahiGuard AG710, SURFLON S-382, SC101, SC102, SC103, SC104, SC105, and SC106 (manufactured by Asahi Glass Co., Ltd.); and organosiloxane polymer KP341 (manufactured by Shin-Etsu Chemical Co., Ltd.). These surfactants may be used alone, or two or more of them may be used in combination. In the case where the surfactant is used, the percentage thereof is 0.0001 part by mass to 5 parts by mass, or 0.001 part by mass to 1 part by mass, or 0.01 part by mass to 0.5 part by mass, with respect to 100 parts by mass of the condensate (polyorganosiloxane).

To the resist underlayer film-forming composition of the present invention, a rheology modifier, an adhesion auxiliary agent, and the like can be added. The rheology modifier is useful to improve fluidity of an underlayer film-forming composition. The adhesion auxiliary agent is useful to improve adhesion between a semiconductor substrate or a resist and an underlayer film.

A solvent used for the resist underlayer film-forming composition of the present invention is not particularly limited, provided that the solid content described above can be dissolved in the solvent. Examples of the solvent include methyl cellosolve acetate, ethyl cellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methyl propionate, ethoxy ethyl acetate, hydroxy ethyl acetate, methyl 2-hydroxy-3-methyl butanoate, methyl 3-methoxy propionate, ethyl 3-methoxy propionate, ethyl 3-ethoxy propionate, methyl 3-ethoxy propionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, hydroxy ethyl acetate, ethyl 2-hydroxy-2-methyl propionate, methyl 3-methoxy-2-methyl propionate, methyl 2-hydroxy-3-methyl butyrate, methoxyacetic acid ethyl ester, ethoxyacetic acid ethyl ester, 3-methoxypropionic acid methyl ester, 3-ethoxypropionic acid ethyl ester, 3-methoxypropionic acid ethyl ester, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, acetoacetic acid methyl ester, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methyl pyrrolidone, 4-methyl-2-pentanol, and γ-butyrolactone. These solvents can be used alone, or two or more of them can be used in combination.

In the present invention, a resist underlayer film-forming composition for EUV lithography can comprise a hydrolyzable organosilane, a hydrolyzed product thereof, or a hydrolyzed condensate thereof as a silane, in which the hydrolyzable organosilane is a silane of Formula (2). Examples of the hydrolyzable organosilane include bis triethoxysilyl ethane, bis triethoxysilyl methane, bis triethoxy silane, and bis triethoxysilyl octane.

The resist underlayer film-forming composition for EUV lithography comprising a hydrolyzable organosilane, a hydrolyzed product thereof, or a hydrolyzed condensate thereof as a silane, in which the hydrolyzable organosilane is a silane of Formula (2), can be used in combination with any of the structures described in the specification.

A semiconductor substrate (for example, a silicon/silicon dioxide coated substrate, a silicon nitride substrate, a glass substrate, and an ITO substrate) is coated with the resist underlayer film-forming composition of the present invention by a suitable coating method such as a spinner and a coater, and then the semiconductor substrate is baked to form a resist underlayer film.

As baking conditions, a baking temperature and a baking time are suitably selected from a range of 80° C. to 250° C. and a range of 0.3 minute to 60 minutes, respectively. Preferably, a baking temperature is 130° C. to 250° C., and a baking time is 0.5 minute to 5 minutes. A film thickness of the formed resist underlayer film is, for example, 0.005 µm to 3.0 µm, preferably, for example, 0.01 µm to 1.0 µm, or 0.01 µm to 0.5 µm, or 0.01 µm to 0.05 µm.

Next, a layer of a high energy beam resist, such as an EUV resist, is formed on the resist underlayer film. The layer of a high energy beam resist can be formed by a well-known method, in which applying a solution of a high energy beam resist composition onto the underlayer film, and baking the composition.

Examples of the EUV resist include resist compositions using PMMA (polymethyl methacrylate), polyhydroxy styrene, or a resin such as a phenol resin.

Exposure is then conducted through a given mask. For exposure, EUV light (13.5 nm), an electron beam, X-ray, or the like can be used. If desired, post exposure bake (PEB) can be conducted. A baking temperature and a baking time for PEB are suitably selected from a range of 70° C. to 150° C. and a range of 0.3 minute to 10 minutes, respectively.

Next, development is conducted with a developing solution. Examples of the developing solution include alkaline aqueous solutions, such as an aqueous solution of an alkali metal hydroxide, such as potassium hydroxide and sodium hydroxide; an aqueous solution of quaternary ammonium hydroxide, such as tetramethylammonium hydroxide, tetraethylammonium hydroxide, and choline; and an aqueous solution of amine, such as ethanolamine, propylamine, and ethylenediamine. A surfactant and the like can further be added to the developing solution. Conditions of development are suitably selected from temperature within a range from 5° C. to 50° C., and time within a range from 10 seconds to 300 seconds.

In the present invention, an organic solvent can be used as a developing solution. After exposure, development is conducted with a developing solution (solvent). Accordingly, for example, when a positive-type photoresist is used, a photoresist in an unexposed portion is removed to form a photoresist pattern.

Examples of the developing solution include methyl acetate, butyl acetate, ethyl acetate, isopropyl acetate, amyl acetate, isoamyl acetate, methoxy ethyl acetate, ethoxy ethyl acetate, propylene glycol monomethyl ether acetate, ethylene glycol monomethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxy butyl acetate, 3-methoxy butyl acetate, 4-methoxy butyl acetate, 3-methyl-3-methoxy butyl acetate, 3-ethyl-3-methoxy butyl acetate, propylene glycol monomethyl ether acetate, propylene glycol monoethyl ether acetate, propylene glycol monopropyl ether acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, 2-hydroxypropionic acid methyl ester, 2-hydroxypropionic acid ethyl ester, methyl-3-methoxy propionate, ethyl-3-methoxy propionate, ethyl-3-ethoxy propionate, and propyl-3-methoxy propionate. A surfactant and the like can further be added to the developing solution. Conditions of development are suitably selected from temperature within a range from 5° C. to 50° C., and time within a range from 10 seconds to 600 seconds.

By using the photoresist pattern formed as such, as a protection film, removal of the resist underlayer film and processing of a semiconductor substrate are conducted. The resist underlayer film is removed with a gas, such as tetrafluoromethane, perfluorocyclobutane ($C_4F_8$), perfluoropropane ($C_3F_8$), trifluoro methane, carbon monoxide, argon, oxygen, nitrogen, sulfur hexafluoride, difluoromethane, nitrogen trifluoride, and chlorine trifluoride.

A planarizing film, a gap-filling material layer, or an organic underlayer film can also be formed before the resist underlayer film of the present invention is formed on a semiconductor substrate. When the semiconductor substrate to be used has a large bump or a hole, it is preferable to form a planarizing film or a gap-filling material layer.

The EUV resist underlayer film can be used for the purpose described below, in addition to the function as a hardmask. The resist underlayer film-forming composition of above can be used as an EUV resist underlayer anti-reflective coating. By using the EUV resist underlayer anti-reflective coating at the time of EUV exposure (the wavelength of 13.5 nm), reflection of undesirable exposure light, such as UV and DUV (ArF light and KrF light), from a substrate or an interface can be prevented without intermixing with the EUV resist. Reflection can efficiently be prevented at the EUV resist underlayer. When used as the EUV resist underlayer film, the resist underlayer film-forming composition of the present invention can be used in the same manner as in the case of a photoresist underlayer.

EXAMPLES

Synthesis Example 1

24.48 g (70 mol %) of tetramethoxysilane, 9.39 g (30 mol %) of methyltrimethoxysilane, and 50.81 g of acetone were placed in a 300 ml flask, and 15.31 g of 0.01 mol/l hydrochloric acid was added dropwise to the mixed solution with stirring with a magnetic stirrer. After the addition, the flask was transferred into an oil bath adjusted at 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid through vacuum distillation. After concentration, a propylene glycol monomethyl ether acetate solution of a hydrolyzed condensate (polymer) was obtained. Propylene glycol monoethyl ether was added to the solution so that the solvent ratio of propylene glycol monomethyl ether acetate/propylene glycol monoethyl ether was adjusted to be 20/80, and the solution was adjusted to be 20% by weight in terms of the solid residue at 140° C. The obtained polymer is represented by Formula (2-1), and has a weight-average molecular weight determined by GPC of Mw 2,000 in terms of polystyrene.

Synthesis Example 2

24.06 g (70 mol %) of tetramethoxysilane, 7.69 g (25 mol %) of methyltrimethoxysilane, 2.24 g (5 mol %) of phenyltrimethoxysilane, and 50.97 g of acetone were placed in a 300 ml flask, and 15.04 g of 0.01 mol/l hydrochloric acid was added dropwise to the mixed solution with stirring with a magnetic stirrer. After the addition, the flask was transferred into an oil bath adjusted at 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid through vacuum distillation. After concentration, a propylene glycol monomethyl ether acetate solution of a hydrolyzed condensate (polymer) was obtained. Propylene glycol monoethyl ether was added to the solution so that the solvent ratio of propylene glycol monomethyl ether acetate/propylene glycol monoethyl ether was adjusted to be 20/80, and the solution was adjusted to be 20% by weight in terms of the solid residue at 140° C. The obtained polymer is represented by Formula (2-2), and has a weight-average molecular weight determined by GPC of Mw 2,000 in terms of polystyrene.

Synthesis Example 3

23.85 g (70 mol %) of tetramethoxysilane, 7.62 g (25 mol %) of methyltrimethoxysilane, 2.56 g (5 mol %) of 4-(methoxyphenyl)trimethoxysilane, and 51.05 g of acetone were placed in a 300 ml flask, and 14.92 g of 0.01 mol/l hydrochloric acid was added dropwise to the mixed solution with stirring with a magnetic stirrer. After the addition, the flask was transferred into an oil bath adjusted at 85° C., and the solution was warmed to reflux for 240 minutes to be reacted.

The reaction solution was then cooled to room temperature, and 68.00 g of propylene glycol monomethyl ether acetate was added to the reaction solution to remove methanol as a reaction by-product, acetone, water, and hydrochloric acid through vacuum distillation. After concentration, a propylene glycol monomethyl ether acetate solution of a hydrolyzed condensate (polymer) was obtained. Propylene glycol monoethyl ether was added to the solution so that the solvent ratio of propylene glycol monomethyl ether acetate/propylene glycol monoethyl ether was adjusted to be 20/80, and the solution was adjusted to be 20% by weight in terms of the solid residue at 140° C.

The obtained polymer is represented by Formula (2-3), and has a weight-average molecular weight determined by GPC of Mw 2,000 in terms of polystyrene.

Synthesis Example 4

22.68 g (70 mol %) of tetramethoxysilane, 7.25 g (25 mol %) of methyltrimethoxysilane, 4.40 g (5 mol %) of 3-(triethoxysilyl)propyldiallyl isocyanurate, and 51.50 g of acetone were placed in a 300 ml flask, and 14.18 g of 0.01 mol/l hydrochloric acid was added dropwise to the mixed solution with stirring with a magnetic stirrer. After the addition, the flask was transferred into an oil bath adjusted at 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid through vacuum distillation. After concentration, a propylene glycol monomethyl ether acetate solution of a hydrolyzed condensate (polymer) was obtained. Propylene glycol monoethyl ether was added to the solution so that the solvent ratio of propylene glycol monomethyl ether acetate/propylene glycol monoethyl ether was adjusted to be 20/80, and the solution was adjusted to be 20% by weight in terms of the solid residue at 140° C. The obtained polymer is represented by Formula (2-4), and has a weight-average molecular weight determined by GPC of Mw 2,000 in terms of polystyrene.

Synthesis Example 5

21.62 g (70 mol %) of tetramethoxysilane, 4.15 g (15 mol %) of methyltrimethoxysilane, 4.20 g (5 mol %) of 3-(triethoxysilyl)propyldiallyl isocyanurate, 4.63 g (10 mol %) of 4-(methoxyphenyl)trimethoxysilane, and 51.89 g of acetone were placed in a 300 ml flask, and 13.52 g of 0.01 mol/l hydrochloric acid was added dropwise to the mixed solution with stirring with a magnetic stirrer. After the addition, the flask was transferred into an oil bath adjusted at 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid through vacuum distillation. After concentration, a propylene glycol monomethyl ether acetate solution of a hydrolyzed condensate (polymer) was obtained. Propylene glycol monoethyl ether was added to the solution so that the solvent ratio of propylene glycol monomethyl ether acetate/propylene glycol monoethyl ether was adjusted to be 20/80, and the solution was adjusted to be 20% by weight in terms of the solid residue at 140° C. The obtained polymer is represented by Formula (2-5), and has a weight-average molecular weight determined by GPC of Mw 2,000 in terms of polystyrene.

Synthesis Example 6

23.19 g (70 mol %) of tetramethoxysilane, 7.41 g (25 mol %) of methyltrimethoxysilane, 3.59 g (5 mol %) of pentafluorophenyl triethoxysilane, and 51.30 g of acetone were placed in a 300 ml flask, and 14.50 g of 0.01 mol/l hydrochloric acid was added dropwise to the mixed solution with stirring with a magnetic stirrer, After the addition, the flask was transferred into an oil bath adjusted at 85° C., and the solution was warmed to reflux for 240 minutes to be reacted.

The reaction solution was then cooled to room temperature, and 68.00 g of propylene glycol monomethyl ether acetate was added to the reaction solution to remove methanol as a reaction by-product, acetone, water, and hydrochloric acid through vacuum distillation. After concentration, a propylene glycol monomethyl ether acetate solution of a hydrolyzed condensate (polymer) was obtained. Propylene glycol monoethyl ether was added to the solution so that the solvent ratio of propylene glycol monomethyl ether acetate/ propylene glycol monoethyl ether was adjusted to be 20/80, and the solution was adjusted to be 20% by weight in terms of the solid residue at 140° C. The obtained polymer is represented by Formula (2-6), and has a weight-average molecular weight determined by GPC of Mw 2,000 in terms of polystyrene.

Synthesis Example 7

23.55 g (70 mol %) of tetramethoxysilane, 7.53 g (25 mol %) of methyltrimethoxysilane, 3.04 g (5 mol %) of p-chlorophenyl triethoxysilane, and 51.16 g of acetone were placed in a 300 ml flask, and 14.73 g of 0.01 mol/l hydrochloric acid was added dropwise to the mixed solution with stirring with a magnetic stirrer.

After the addition, the flask was transferred into an oil bath adjusted at 85° C., and the solution was warmed to reflux for 240 minutes to be reacted.

The reaction solution was then cooled to room temperature, and 68.00 g of propylene glycol monomethyl ether acetate was added to the reaction solution to remove methanol as a reaction by-product, acetone, water, and hydrochloric acid through vacuum distillation. After concentration, a propylene glycol monomethyl ether acetate solution of a hydrolyzed condensate (polymer) was obtained. Propylene glycol monoethyl ether was added to the solution so that the solvent ratio of propylene glycol monomethyl ether acetate/ propylene glycol monoethyl ether was adjusted to be 20/80, and the solution was adjusted to be 20% by weight in terms of the solid residue at 140° C. The obtained polymer is represented by Formula (2-7), and has a weight-average molecular weight determined by GPC of Mw 2,000 in terms of polystyrene.

Synthesis Example 8

23.04 g (70 mol %) of tetramethoxysilane, 7.36 g (25 mol %) of methyltrimethoxysilane, 3.83 g (5 mol %) of bis triethoxysilyl ethane, and 51.35 g of acetone were placed in a 300 ml flask, and 14.41 g of 0.01 mol/l hydrochloric acid was added dropwise to the mixed solution with stirring with a magnetic stirrer. After the addition, the flask was transferred into an oil bath adjusted at 85° C., and the solution was warmed to reflux for 240 minutes to be reacted.

The reaction solution was then cooled to room temperature, and 68.00 g of propylene glycol monomethyl ether acetate was added to the reaction solution to remove methanol as a reaction by-product, acetone, water, and hydrochloric acid through vacuum distillation. After concentration, a propylene glycol monomethyl ether acetate solution of a hydrolyzed condensate (polymer) was obtained. Propylene glycol monoethyl ether was added to the solution so that the solvent ratio of propylene glycol monomethyl ether acetate/ propylene glycol monoethyl ether was adjusted to be 20/80, and the solution was adjusted to be 20% by weight in terms of the solid residue at 140° C.

The obtained polymer is represented by Formula (2-8), and has a weight-average molecular weight determined by GPC of Mw 2,000 in terms of polystyrene.

Synthesis Example 9

24.17 g (70 mol %) of tetramethoxysilane, 8.96 g (29 mol %) of methyltrimethoxysilane, 0.82 g (1 mol %) of N-3-(triethoxysilyl)propylbenzenesulfonamide, and 50.93 g of acetone were placed in a 300 ml flask, and 15.12 g of 0.01 mol/l hydrochloric acid was added dropwise to the mixed solution with stirring with a magnetic stirrer. After the addition, the flask was transferred into an oil bath adjusted at 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid through vacuum distillation. After concentration, a propylene glycol monomethyl ether acetate solution of a hydrolyzed condensate (polymer) was obtained. Propylene glycol monoethyl ether was added to the solution so that the solvent ratio of propylene glycol monomethyl ether acetate/propylene glycol monoethyl ether was adjusted to be 20/80, and the solution was adjusted to be 20% by weight in terms of the solid residue at 140° C. The obtained polymer is represented by Formula (2-9), and has a weight-average molecular weight determined by GPC of Mw 2,000 in terms of polystyrene.

Synthesis Example 10

27.61 g (80 mol %) of tetramethoxysilane, 6.18 g (20 mol %) of methyltrimethoxysilane, and 50.69 g of acetone were placed in a 300 ml flask, and 15.52 g of 0.01 mol/l hydrochloric acid was added dropwise to the mixed solution with stirring with a magnetic stirrer. After the addition, the flask was transferred into an oil bath adjusted at 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid through vacuum distillation. After concentration, a propylene glycol monomethyl ether acetate solution of a hydrolyzed condensate (polymer) was obtained.

Propylene glycol monoethyl ether was added to the solution so that the solvent ratio of propylene glycol monomethyl ether acetate/propylene glycol monoethyl ether was adjusted to be 20/80, and the solution was adjusted to be 20% by weight in terms of the solid residue at 140° C. The obtained polymer is represented by Formula (2-1), and has a weight-average molecular weight determined by GPC of Mw 2,000 in terms of polystyrene.

Synthesis Example 11

24.20 g (70 mol %) of tetramethoxysilane, 8.97 g (29 mol %) of methyltrimethoxysilane, 0.77 g of N-(3-triethoxysilylpropyl)ethyl-4,5-dihydroimidazolium chloride, and 50.92 g of acetone were placed in a 300 ml flask, and 15.14 g of 0.01 mol/l hydrochloric acid was added dropwise to the mixed solution with stirring with a magnetic stirrer. After the addition, the flask was transferred into an oil bath adjusted at 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid through vacuum distillation. After concentration, a propylene glycol monomethyl ether acetate solution of a hydrolyzed condensate (polymer) was obtained. Propylene glycol monoethyl ether was added to the solution so that the solvent ratio of propylene glycol monomethyl ether acetate/propylene glycol monoethyl ether was adjusted to be 20/80, and the solution was adjusted to be 20% by weight in terms of the solid residue at 140° C. The obtained polymer is represented by Formula (2-10), and has a weight-average molecular weight determined by GPC of Mw 2,000 in terms of polystyrene.

Synthesis Example 12

24.25 g (70 mol %) of tetramethoxysilane, 8.99 g (29 mol %) of methyltrimethoxysilane, 0.69 g of 3-(triethoxysilyl)propyl succinic anhydride, and 50.90 g of acetone were placed in a 300 ml flask, and 15.17 g of 0.01 mol/l hydrochloric acid was added dropwise to the mixed solution with stirring with a magnetic stirrer. After the addition, the flask was transferred into an oil bath adjusted at 85° C., and the solution was warmed to reflux for 240 minutes to be reacted.

The reaction solution was then cooled to room temperature, and 68.00 g of propylene glycol monomethyl ether acetate was added to the reaction solution to remove methanol as a reaction by-product, acetone, water, and hydrochloric acid through vacuum distillation. After concentration, a propylene glycol monomethyl ether acetate solution of a hydrolyzed condensate (polymer) was obtained. Propylene glycol monoethyl ether was added to the solution so that the solvent ratio of propylene glycol monomethyl ether acetate/propylene glycol monoethyl ether was adjusted to be 20/80, and the solution was adjusted to be 20% by weight in terms of the solid residue at 140° C. The obtained polymer is represented by Formula (2-11), and has a weight-average molecular weight determined by GPC of Mw 2,000 in terms of polystyrene.

Synthesis Example 13

23.87 g (70 mol %) of tetramethoxysilane, 8.85 g (29 mol %) of methyltrimethoxysilane, 1.31 g of 3-(triethoxysilyl)propyl succinic acid mono triphenyl sulfonium salt, and 51.04 g of acetone were placed in a 300 ml flask, and 14.93 g of 0.01 mol/l hydrochloric acid was added dropwise to the mixed solution with stirring with a magnetic stirrer. After the addition, the flask was transferred into an oil bath adjusted at 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid through vacuum distillation. After concentration, a propylene glycol monomethyl ether acetate solution of a hydrolyzed condensate (polymer) was obtained. Propylene glycol monoethyl ether was added to the solution so that the solvent ratio of propylene glycol monomethyl ether acetate/propylene glycol monoethyl ether was adjusted to be 20/80, and the solution was adjusted to be 20% by weight in terms of the solid residue at 140° C. The obtained polymer is represented by Formula (2-12), and has a weight-average molecular weight determined by GPC of Mw 2,000 in terms of polystyrene.

Synthesis Example 14

24.03 g (70 mol %) of tetramethoxysilane, 8.91 g (29 mol %) of methyltrimethoxysilane, 1.05 g of 3-(trihydroxysilyl)propane sulfonic acid triphenyl sulfonium salt, and 50.98 g of acetone were placed in a 300 ml flask, and 15.03 g of 0.01 mol/l hydrochloric acid was added dropwise to the mixed solution with stirring with a magnetic stirrer. After the addition, the flask was transferred into an oil bath adjusted at 85° C., and the solution was warmed to reflux for 240 minutes to be reacted. The reaction solution was then cooled to room temperature, and 68.00 g of propylene glycol monomethyl ether acetate was added to the reaction solution to remove methanol as a reaction by-product, acetone, water, and hydrochloric acid through vacuum distillation. After concentration, a propylene glycol monomethyl ether acetate solution of a hydrolyzed condensate (polymer) was obtained. Propylene glycol monoethyl ether was added to the solution so that the solvent ratio of propylene glycol monomethyl ether acetate/propylene glycol monoethyl ether was adjusted to be 20/80, and the solution was adjusted to be 20% by weight in terms of the solid residue at 140° C. The obtained polymer is represented by Formula (2-13), and has a weight-average molecular weight determined by GPC of Mw 2,000 in terms of polystyrene.

(Preparation of Si-Containing Resist Underlayer Film)

Each of the silicon-containing polymers obtained in the synthesis example of above, an acid, a curing catalyst, a salt of a sulfonic acid ion containing a hydrocarbon group with an onium ion, a solvent, and water were mixed according to the mixing ratio shown in Table 1, and then the mixture was filtrated through a fluorine resin filter having a pore size of 0.1 μm to prepare each of the resist underlayer film-forming composition solutions. The addition ratios of the polymers shown in Table 1 represent addition amounts of polymers themselves, and do not represent addition amounts of polymer solutions.

As the salt of a sulfonic acid ion containing a hydrocarbon group with an onium ion, triphenylsulfonium camphorsulfonate (TPSCS), triphenylsulfonium p-toluenesulfonate (TPSPTS), triphenylsulfonium methanesulfonate (TPSMS), triphenylsulfonium trifluoromethanesulfonate (TPSTf), benzyltriethylammonium camphorsulfonate (BTEACS), benzyltriethylammonium p-toluenesulfonate (BTEAPTS), benzyltriethylammonium methanesulfonate (BTEAMS), benzyltriethylammonium trifluoromethanesulfonate (BTEATf), trihydroxyphenylsulfonium camphorsulfonate (THPSCS), or triphenylsulfonium adamantanecarbonyloxy-1,1-difluoroethane-1-sulfonate (TPSAdS) was used.

The abbreviations in Table 1 are described below: MA is maleic acid, BTEAC is benzyltriethylammonium chloride, TPSCl is triphenylsulfonium chloride, TPSMA is monotriphenylsulfonium maleate, TPSNO$_3$ is triphenylsulfonium nitrate, NaCS is camphorsulfonic acid sodium salt, PGMEA is propylene glycol monomethyl ether acetate, PGEE is propylene glycol monoethyl ether, and PGME is propylene glycol monomethyl ether. The water used was ultrapure water. Each of the addition amounts is represented by parts by mass.

TABLE 1

| | Polymer | Acid | Curing Catalyst | Onium Sulfonate | Solvent | | | Water |
|---|---|---|---|---|---|---|---|---|
| Example 1 | Synthesis Example 1 | MA | TPSMA | TPSMS | PGME | PGEE | PGMEA | Water |
| (Parts by Mass) | 2 | 0.02 | 0.02 | 0.06 | 10 | 76 | 7 | 7 |
| Example 2 | Synthesis Example 1 | MA | TPSNO3 | TPSCS | PGME | PGEE | PGMEA | Water |
| (Parts by Mass) | 2 | 0.02 | 0.02 | 0.06 | 10 | 76 | 7 | 7 |
| Example 3 | Synthesis Example 2 | MA | TPSCl | TPSPTS | PGME | PGEE | PGMEA | Water |
| (Parts by Mass) | 2 | 0.02 | 0.02 | 0.06 | 10 | 76 | 7 | 7 |
| Example 4 | Synthesis Example 3 | MA | BTEAC | TPSCS | PGME | PGEE | PGMEA | Water |
| (Parts by Mass) | 2 | 0.02 | 0.02 | 0.06 | 10 | 76 | 7 | 7 |
| Example 5 | Synthesis Example 1 | MA | TPSMA | BTEAMS | PGME | PGEE | PGMEA | Water |
| (Parts by Mass) | 2 | 0.02 | 0.02 | 0.06 | 10 | 76 | 7 | 7 |
| Example 6 | Synthesis Example 1 | MA | TPSNO3 | BTEACS | PGME | PGEE | PGMEA | Water |
| (Parts by Mass) | 2 | 0.02 | 0.02 | 0.06 | 10 | 76 | 7 | 7 |
| Example 7 | Synthesis Example 2 | MA | TPSCl | BTEAPTS | PGME | PGEE | PGMEA | Water |
| (Parts by Mass) | 2 | 0.02 | 0.02 | 0.06 | 10 | 76 | 7 | 7 |
| Example 8 | Synthesis Example 3 | MA | BTEAC | BTEACS | PGME | PGEE | PGMEA | Water |
| (Parts by Mass) | 2 | 0.02 | 0.02 | 0.06 | 10 | 76 | 7 | 7 |
| Example 9 | Synthesis Example 4 | MA | TPSMA | TPSMS | PGME | PGEE | PGMEA | Water |
| (Parts by Mass) | 2 | 0.02 | 0.02 | 0.06 | 10 | 76 | 7 | 7 |
| Example 10 | Synthesis Example 5 | MA | BTEAC | TPSCS | PGME | PGEE | PGMEA | Water |
| (Parts by Mass) | 2 | 0.02 | 0.02 | 0.06 | 10 | 76 | 7 | 7 |
| Example 11 | Synthesis Example 6 | MA | TPSNO3 | TPSCS | PGME | PGEE | PGMEA | Water |
| (Parts by Mass) | 2 | 0.02 | 0.02 | 0.06 | 10 | 76 | 7 | 7 |
| Example 12 | Synthesis Example 7 | MA | TPSCl | TPSPTS | PGME | PGEE | PGMEA | Water |
| (Parts by Mass) | 2 | 0.02 | 0.02 | 0.06 | 10 | 76 | 7 | 7 |
| Example 13 | Synthesis Example 8 | MA | BTEAC | TPSCS | PGME | PGEE | PGMEA | Water |
| (Parts by Mass) | 2 | 0.02 | 0.02 | 0.06 | 10 | 76 | 7 | 7 |
| Example 14 | Synthesis Example 9 | MA | TPSMA | TPSMS | PGME | PGEE | PGMEA | Water |
| (Parts by Mass) | 2 | 0.02 | 0.02 | 0.06 | 10 | 76 | 7 | 7 |
| Example 15 | Synthesis Example 10 | MA | TPSNO3 | TPSCS | PGME | PGEE | PGMEA | Water |
| (Parts by Mass) | 2 | 0.02 | 0.02 | 0.06 | 10 | 76 | 7 | 7 |
| Example 16 | Synthesis Example 11 | MA | TPSMA | TPSPTS | PGME | PGEE | PGMEA | Water |
| (Parts by Mass) | 2 | 0.02 | 0.02 | 0.06 | 10 | 76 | 7 | 7 |

TABLE 1-continued

| | Polymer | Acid | Curing Catalyst | Onium Sulfonate | Solvent | | | Water |
|---|---|---|---|---|---|---|---|---|
| Example 17 | Synthesis Example 12 | MA | TPSNO3 | TPSPCS | PGME | PGEE | PGMEA | Water |
| (Parts by Mass) | 2 | 0.02 | 0.02 | 0.06 | 10 | 76 | 7 | 7 |
| Example 18 | Synthesis Example 13 | MA | TPSCl | TPSPTS | PGME | PGEE | PGMEA | Water |
| (Parts by Mass) | 2 | 0.02 | 0.02 | 0.06 | 10 | 76 | 7 | 7 |
| Example 19 | Synthesis Example 14 | MA | BTEAC | TPSCS | PGME | PGEE | PGMEA | Water |
| (Parts by Mass) | 2 | 0.02 | 0.02 | 0.06 | 10 | 76 | 7 | 7 |
| Example 20 | Synthesis Example 2 | MA | TPSNO3 | TPSCS | PGME | PGEE | PGMEA | Water |
| (Parts by Mass) | 2 | 0.02 | 0.02 | 0.1 | 10 | 76 | 7 | 7 |
| Example 21 | Synthesis Example 2 | MA | TPSNO3 | TPSCS | PGME | PGEE | PGMEA | Water |
| (Parts by Mass) | 2 | 0.02 | 0.02 | 0.3 | 10 | 76 | 7 | 7 |
| Example 22 | Synthesis Example 2 | MA | TPSNO3 | THPSCS | PGME | PGEE | PGMEA | Water |
| (Parts by Mass) | 2 | 0.02 | 0.02 | 0.1 | 10 | 76 | 7 | 7 |
| Example 23 | Synthesis Example 2 | MA | TPSNO3 | TPSAdS | PGME | PGEE | POMP A | Water |
| (Parts by Mass) | 2 | 0.02 | 0.02 | 0.02 | 10 | 76 | 7 | 7 |
| Comparative Example 1 | Synthesis Example 1 | MA | TPSMA | | PGME | PGEE | PGMEA | Water |
| (Parts by Mass) | 2 | 0.02 | 0.02 | | 10 | 76 | 7 | 7 |
| Comparative Example 2 | Synthesis Example 3 | MA | BTEAC | | PGME | PGEE | PGMEA | Water |
| (Parts by Mass) | 2 | 0.02 | 0.02 | | 10 | 76 | 7 | 7 |
| Comparative Example 3 | Synthesis Example 1 | MA | TPSMA | TPSTf | PGME | PGEE | PGMEA | Water |
| (Parts by Mass) | 2 | 0.02 | 0.02 | 0.06 | 10 | 76 | 7 | 7 |
| Comparative Example 4 | Synthesis Example 3 | MA | TPSMA | BTEATf | PGME | PGEE | PGMEA | Water |
| (Parts by Mass) | 2 | 0.02 | 0.02 | 0.06 | 10 | 76 | 7 | 7 |
| Comparative Example 5 | Synthesis Example 1 | MA | BTEAC | NaCS | PGME | PGEE | PGMEA | Water |
| (Parts by Mass) | 2 | 0.02 | 0.02 | 0.06 | 10 | 76 | 7 | 7 |

(Preparation of Organic Resist Underlayer Film)

Carbazole (6.69 g, 0.040 mol, manufactured by Tokyo Chemical Industry Co., Ltd.), 9-fluorenone (7.28 g, 0.040 mol, manufactured by Tokyo Chemical Industry Co., Ltd.), and para-toluenesulfonic acid monohydrate (0.76 g, 0.0040 mol, manufactured by Tokyo Chemical Industry Co., Ltd.) were placed in a 100 mL four-neck flask under a nitrogen gas, and then 1,4-dioxane (6.69 g, manufactured by Kanto Chemical Co., Inc.) was added thereto and stirred. The temperature was raised to 100° C. in order to dissolve the content and polymerization is initiated. After 24 hours, the content was cooled to 60° C. The content was diluted by adding chloroform (34 g, manufactured by Kanto Chemical Co., Inc.), and was re-precipitated in methanol (168 g, manufactured by Kanto Chemical Co., Inc.). The obtained precipitate was filtrated and dried in a vacuum dryer at 80° C. for 24 hours to obtain 9.37 g of the target polymer (Formula (3-1), hereinafter, abbreviated as PCzFL).

Formula (3-1)

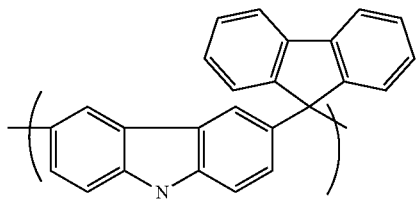

The PCzFL was measured by $^1$H-NMR, and the result is shown below: $^1$H-NMR (400 MHz, DMSO-d6): δ7.03-7.55 (br, 12H), δ7.61-8.10 (br, 4H), δ11.18 (br, 1H). The weight-average molecular weight (Mw) of PCzFL determined by GPC was 2,800 in terms of polystyrene, and polydispersity (Mw/Mn) was 1.77.

20 g of the obtained resin was mixed with 3.0 g of tetramethoxymethyl glycoluril (the product name: Powder Link 1174, manufactured by Mitsui Cytec, Ltd.) as a cross-linker, 0.30 g of pyridinium para-toluenesulfonate as a catalyst, and 0.06 g of MEGAFAC R-30 (the product name, manufactured by Dainippon Ink and Chemicals, Incorporated) as a surfactant, and the mixture was dissolved in 88 g of propylene glycol monomethyl ether acetate to prepare a solution. Subsequently, the solution was filtrated through a polyethylene microfilter having a pore size of 0.10 μm, followed by filtering through a polyethylene microfilter having a pore size of 0.05 μm to prepare a solution of the organic resist underlayer film-forming composition used for a multilayer film lithography process.

(Measurement of Optical Constant)

The Si-containing resist underlayer film-forming compositions, which were prepared in Examples 1 to 23 and Comparative Examples 1 to 5, were applied onto respective silicon wafers by using a spinner. The silicon wafers were each baked on a hot plate at 200° C. for 1 minute to form the Si-containing resist underlayer film (having a film thickness of 0.05 μm). For each of these resist underlayer films, a refractive index (the n value) and an optical absorption coefficient (the k value, also called an attenuation coefficient) at the wavelengths of 193 nm were measured by using a spectral ellipsometer (VUV-VASEVU-302 manufactured by J.A. Woollam Co. Inc.).

(Measurement of Dry Etching Rate)

The etcher and etching gas used for measuring a dry etching rate are described below:

ES401 (manufactured by Nippon Scientific Co., Ltd.) for $CF_4$, and

RIE-10NR (manufactured by SAMCO INC.) for $O_2$

The solutions of Si-containing resist underlayer film-forming compositions prepared in Examples 1 to 23 and Comparative Examples 1 to 5 were applied onto respective silicon wafers by using a spinner. The silicon wafers were each heated on a hot plate at 240° C. for 1 minute to form the corresponding Si-containing resist underlayer film having a film thickness of 0.08 μm for measuring an etching rate with $CF_4$ gas, and to form the corresponding Si-containing resist underlayer film having a film thickness of 0.05 μm for measuring an etching rate with $O_2$ gas. Similarly, a silicon wafer was coated with an organic underlayer film-forming composition by using a spinner to form a film (having a film thickness of 0.20 μm). The dry etching rate was measured by using $O_2$ gas as an etching gas, and the result was compared with each of the dry etching rates of the Si-containing resist underlayer films of Examples 1 to 19 and of Comparative Examples 1 to 5.

(Evaluation of Resist Patterning)

The obtained organic underlayer film (A layer)-forming composition containing PCzFL was applied onto a silicon wafer, and was baked on a hot plate at 240° C. for 60 seconds to obtain an organic underlayer film (A layer) having a film thickness of 200 nm. Each of the Si-containing resist underlayer film-forming compositions, which were obtained in Examples 1 to 6 and Comparative Examples 1 to 4, was applied onto the organic underlayer film (A layer), and was baked on a hot plate at 240° C. for 45 seconds to obtain a Si-containing resist underlayer film (B layer). The film thickness of the Si-containing resist underlayer film (B layer) was 45 nm.

The commercially available photoresist solution (manufactured by JSR Corporation, the product name: AR2772) was applied onto the Si-containing resist underlayer film (B layer) by using a spinner, and was baked on a hot plate at 110° C. for 60 seconds to form a photoresist film (C layer) having a film thickness of 120 nm. The patterning of the resist was conducted by using the ArF exposure device S-307E (wavelength: 193 nm, NA, σ: 0.85, 0.93/0.85 (Dipole), immersion liquid:water) manufactured by Nikon Corporation. The target was exposed through a mask that allows forming a line and space pattern (dense line) in which the line width and the width between the lines of a photoresist are 0.065 μm after development.

Next, the target was baked on a hot plate at 110° C. for 60 seconds followed by cooling, and then was developed with an aqueous solution of 2.38% by mass tetramethylammonium hydroxide (developing solution) for 60 seconds in the single paddle process. In the skirt shape of the resist pattern after lithography, a rectangle line was evaluated as straight, and a line having wider bottom was evaluated as footing.

Table 2 shows refractive indexes n at the wavelength of 193 nm, optical absorption coefficients k at the wavelength of 193 nm, etch rates when fluorine gas ($CF_4$ gas) was used (an etching rate is nm/minute), and oxygen gas ($O_2$ gas) resistances at etch rate ratios, that is (the resist underlayer film of the present invention)/(the organic underlayer film).

TABLE 2

| | Refractive Index | Optical Absorption Coefficient | Fluorine Gas Etch Rate | Oxygen Gas Resistance |
|---|---|---|---|---|
| Example 1 | 1.56 | 0.00 | 18.6 | 0.02 |
| Example 2 | 1.56 | 0.00 | 18.6 | 0.02 |
| Example 3 | 1.62 | 0.13 | 19.9 | 0.02 |
| Example 4 | 1.52 | 0.15 | 20.6 | 0.03 |
| Example 5 | 1.56 | 0.00 | 18.0 | 0.02 |
| Example 6 | 1.56 | 0.00 | 18.6 | 0.02 |
| Example 7 | 1.62 | 0.13 | 19.1 | 0.02 |
| Example 8 | 1.52 | 0.15 | 20.9 | 0.03 |
| Example 9 | 1.64 | 0.08 | 22.5 | 0.03 |
| Example 10 | 1.62 | 0.25 | 21.7 | 0.03 |
| Example 11 | 1.54 | 0.08 | 19.5 | 0.03 |
| Example 12 | 1.53 | 0.24 | 20.5 | 0.03 |
| Example 13 | 1.56 | 0.00 | 19.2 | 0.02 |
| Example 14 | 1.57 | 0.03 | 19.0 | 0.03 |
| Example 15 | 1.56 | 0.00 | 17.8 | 0.02 |
| Example 16 | 1.57 | 0.00 | 18.2 | 0.02 |
| Example 17 | 1.56 | 0.00 | 20.4 | 0.03 |
| Example 18 | 1.58 | 0.02 | 19.2 | 0.02 |
| Example 19 | 1.55 | 0.01 | 20.7 | 0.03 |
| Example 20 | 1.62 | 0.14 | 20.5 | 0.02 |
| Example 21 | 1.63 | 0.16 | 21.0 | 0.03 |
| Example 22 | 1.62 | 0.14 | 19.8 | 0.02 |
| Example 23 | 1.62 | 0.14 | 20.1 | 0.02 |
| Comparative Example 1 | 1.56 | 0.00 | 18.4 | 0.02 |
| Comparative Example 2 | 1.62 | 0.13 | 19.5 | 0.02 |
| Comparative Example 3 | 1.56 | 0.00 | 18.4 | 0.02 |
| Comparative Example 4 | 1.52 | 0.15 | 20.5 | 0.03 |
| Comparative Example 5 | 1.56 | 0.00 | 18.2 | 0.02 |

Table 3 shows the observation results of the skirt shapes at 65 nm line and space patterns after evaluation of lithography, and the observation results of the skirt shapes when the optimal amount of exposure and the focus for exposure at the 65 nm line and space pattern were reduced 3 mJ/cm² and 0.7 μm, respectively.

TABLE 3

| Amount of Exposure<br>Line Width | 19 mJ/cm²<br>80 nm Line | 22 mJ/cm²<br>65 nm Line | 30 mJ/cm²<br>45 nm Line |
|---|---|---|---|
| Example 1 | Straight | Straight | Straight |
| Example 2 | Straight | Straight | Straight |
| Example 3 | Straight | Straight | Straight |
| Example 4 | Straight | Straight | Straight |
| Example 5 | Straight | Straight | Straight |
| Example 6 | Straight | Straight | Straight |
| Example 7 | Straight | Straight | Straight |
| Example 8 | Straight | Straight | Straight |
| Example 9 | Straight | Straight | Straight |
| Example 10 | Straight | Straight | Straight |
| Example 11 | Straight | Straight | Straight |
| Example 12 | Straight | Straight | Straight |
| Example 13 | Straight | Straight | Straight |
| Example 14 | Straight | Straight | Straight |
| Example 15 | Straight | Straight | Straight |
| Example 16 | Straight | Straight | Straight |
| Example 17 | Straight | Straight | Straight |
| Example 18 | Straight | Straight | Straight |
| Example 19 | Straight | Straight | Straight |
| Example 20 | Straight | Straight | Straight |
| Example 21 | Straight | Straight | Straight |
| Example 22 | Straight | Straight | Straight |
| Example 23 | Straight | Straight | Straight |
| Comparative Example 1 | Footing | Slightly Footing | Straight |
| Comparative Example 2 | Footing | Slightly Footing | Straight |
| Comparative Example 3 | Straight | Undercut | Collapse |
| Comparative Example 4 | Straight | Undercut | Collapse |
| Comparative Example 5 | Footing | Footing | Slightly Footing |

In Table 3, "straight" refers to a preferable rectangle shape of the pattern, "footing" refers to an unfavorable shape in which the bottom of the pattern is expanded, and "undercut" refers to an unfavorable shape having erosion on the bottom of the pattern.

[Resist Pattern Formation by EUV Exposure]

A silicon wafer was coated with the organic underlayer film (A layer)-forming composition, and was baked on a hot plate at 215° C. for 60 seconds to obtain an organic underlayer film (A layer) having a film thickness of 90 nm. The organic underlayer film (A layer) was spin-coated with each of the resist underlayer film-forming composition solutions, which were prepared in Examples 1 to 15, Examples 20 to 23, and Comparative Examples 1, 4, and 5, and was heated at 215° C. for 1 minute to form a resist underlayer film (B) layer (25 nm). The hardmask of the resist underlayer film (B) layer was spin-coated with a resist (a methacrylate resin resist) solution for EUV, and was heated to form an EUV resist (C) layer. The EUV resist (C) layer was exposed by using an EUV exposure device (Micro Exposure Tool, abbreviated as MET) under the condition of NA=0.30, σ=0.36/0.68 Quadropole. After exposure, PEB was conducted, and then the resist film was cooled to room temperature on a cooling plate. Development followed by a rinse treatment was conducted to form a resist pattern. The resist pattern was evaluated whether a line and space pattern of 26 nm is formed, and with a shape of the pattern, which was identified by observing the cross section of the pattern.

In Table 4, (Good) means the state in which the shape is intermediate between the footing shape and the undercut shape, and there is not a significant amount of residues in a space portion, (Collapse) means the unfavorable state in which the resist pattern is detached and collapsed, and (Bridge) means the unfavorable state in which the top portions or bottom portions of the resist patterns are brought into contact with each other.

TABLE 4

|  | Pattern Shape |
| --- | --- |
| Example 1 | Good |
| Example 2 | Good |
| Example 3 | Good |
| Example 4 | Good |
| Example 5 | Good |
| Example 6 | Good |
| Example 7 | Good |
| Example 8 | Good |
| Example 9 | Good |
| Example 10 | Good |
| Example 11 | Good |
| Example 12 | Good |
| Example 13 | Good |
| Example 14 | Good |
| Example 15 | Good |
| Example 20 | Good |
| Example 21 | Good |
| Example 22 | Good |
| Example 23 | Good |
| Comparative Example 1 | Collapse |
| Comparative Example 4 | Bridge |
| Comparative Example 5 | Bridge |

INDUSTRIAL APPLICABILITY

The thin film-forming composition of the present invention can be utilized in resist underlayer film-forming compositions for photoresists, EUV resists, or the like; EUV resist top layer film-forming compositions; reverse material-forming compositions, and the like.

The invention claimed is:

1. A resist underlayer film-forming composition for EUV lithography, comprising:
   a hydrolyzable organosilane, a hydrolyzed product thereof, or a hydrolyzed condensate thereof, as a silane;
   a salt of a sulfonic acid ion with an onium ion;
   an acid; and
   a curing catalyst, wherein:
   the sulfonic acid ion contains a hydrocarbon group optionally substituted by an atom or group other than a fluorine atom, and is selected from the group consisting of:

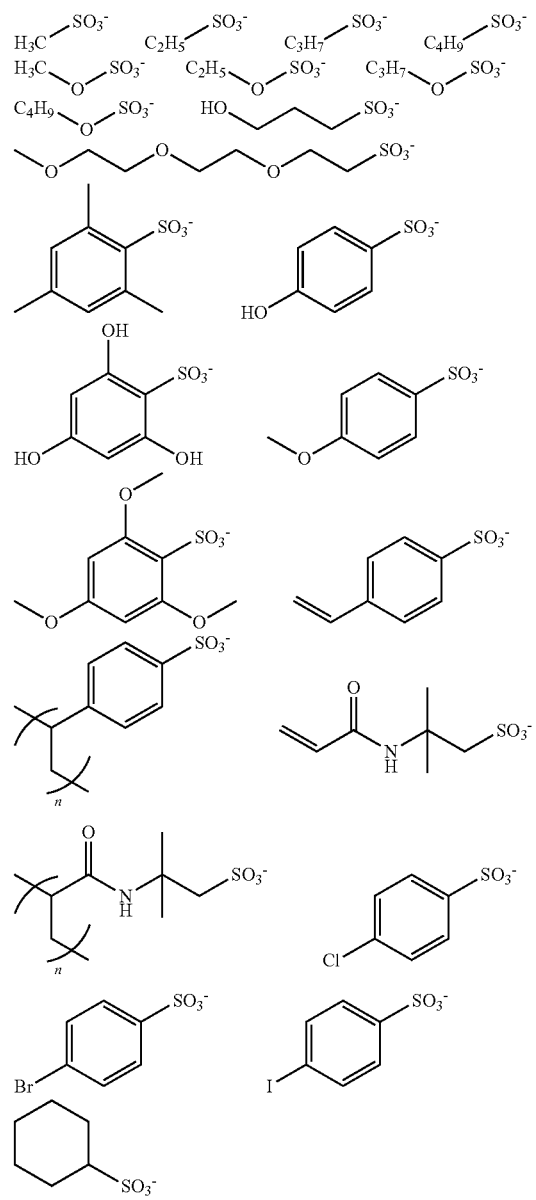

wherein n is 1 to 1,000,
the onium ion is a sulfonium ion or an ammonium ion containing at least one organic group having an aromatic ring, the salt of a sulfonic acid ion with an onium ion is present in the resist underlayer film-forming composition such that the salt of a sulfonic acid ion with an onium ion has a buffering effect of controlling acidity of a resist underlayer film formed from the composition, and the hydrolyzable organosilane comprises at least one organic silicon compound selected from the group consisting of compounds of Formula (1):

$$R^1_a Si(R^2)_{4-a} \qquad \text{Formula (1)}$$

wherein, $R^1$ is an alkyl group, an aryl group, an aralkyl group, a halogenated alkyl group, a halogenated aryl group, a halogenated aralkyl group, or an alkenyl group, or is an organic group having an epoxy group, an acryloyl group, a methacryloyl group, a mercapto group, an alkoxyaryl group, an acyloxyaryl group, an isocyanurate group, a hydroxy group, a cyclic amino group, or a cyano group, or is a combination of such organic groups, and is bonded to a silicon atom through an Si—C bond; $R^2$ is an alkoxy group, an acyloxy group, or a halogen group; and a is an integer of 0 to 3, and compounds of Formula (2):

$$[R^3_c Si(R^4)_{3-c}]_2 Y_b \qquad \text{Formula (2)}$$

wherein $R^3$ is an alkyl group; $R^4$ is an alkoxy group, an acyloxy group, or a halogen group; Y is an alkylene group or an arylene group; b is an integer of 0 or 1; and c is an integer of 0 or 1, a hydrolyzed product thereof, or a hydrolyzed condensate thereof.

2. The resist underlayer film-forming composition according to claim 1, wherein
the resist underlayer film-forming composition comprises the hydrolyzed condensate of the compound of Formula (1) as a polymer.

3. The resist underlayer film-forming composition according to claim 1, further comprising water.

4. A resist underlayer film obtained by applying the resist underlayer film-forming composition as claimed in claim 1 onto a semiconductor substrate, and then baking the applied resist underlayer film-forming composition.

5. A method for manufacturing a semiconductor device, the method comprising:
forming a resist underlayer film by applying the resist underlayer film-forming composition as claimed in claim 1 onto a semiconductor substrate and then baking the applied resist underlayer film-forming composition;
forming a resist film by applying a composition for EUV resists onto the underlayer film;
EUV-exposing the resist film;
obtaining a resist pattern by developing the exposed resist film;
etching the resist underlayer film with the resist pattern; and
processing the semiconductor substrate with the patterned resist film and the patterned resist underlayer film.

6. A method for manufacturing a semiconductor device, the method comprising:
forming an organic underlayer film on a semiconductor substrate;
forming a resist underlayer film by applying the resist underlayer film-forming composition as claimed in claim 1 onto the organic underlayer film, and then baking the applied resist underlayer film-forming composition;
forming a resist film by applying a composition for EUV resists onto the resist underlayer film;
EUV-exposing the resist film;
obtaining a resist pattern by developing the exposed resist film;
etching the resist underlayer film with the resist pattern;
etching the organic underlayer film with the patterned resist underlayer film; and
processing the semiconductor substrate with the patterned organic underlayer film.

7. The resist underlayer film-forming composition according to claim 1, wherein the hydrolyzable organosilane consists essentially of the at least one organic silicon compound.

* * * * *